US012598011B2

(12) United States Patent
Gold et al.

(10) Patent No.: US 12,598,011 B2
(45) Date of Patent: Apr. 7, 2026

(54) METHOD AND APPARATUS FOR TESTING DYNAMIC BEAM ADAPTIVE RADIO RESOURCE MANAGEMENT (RRM) AND DEMODULATION REQUIREMENTS IN OVER THE AIR (OTA) TEST SETUP

(71) Applicant: Nokia Technologies OY, Espoo (FI)

(72) Inventors: Dimitri Gold, Espoo (FI); Axel Mueller, Paris (FR); Lars Dalsgaard, Oulu (FI)

(73) Assignee: NOKIA TECHNOLOGIES OY, Espoo (FI)

( * ) Notice: Subject to any disclaimer, the term of this patent is extended or adjusted under 35 U.S.C. 154(b) by 639 days.

(21) Appl. No.: 18/050,185

(22) Filed: Oct. 27, 2022

(65) Prior Publication Data

US 2024/0146430 A1 May 2, 2024

(51) Int. Cl.
*H04B 17/391* (2015.01)
*H04W 24/06* (2009.01)
*G01R 29/10* (2006.01)

(52) U.S. Cl.
CPC ........ *H04B 17/3912* (2015.01); *H04W 24/06* (2013.01); *G01R 29/105* (2013.01)

(58) Field of Classification Search
CPC ................................................. H04B 17/3912
See application file for complete search history.

(56) References Cited

U.S. PATENT DOCUMENTS 7,797,132 B1 * 9/2010 Lele ......................... G01S 19/03
702/182
2015/0109941 A1 * 4/2015 Zhang ................... H04W 24/06
370/252

FOREIGN PATENT DOCUMENTS

| | | | |
|---|---|---|---|
| FI | 20225166 | 2/2022 | |
| WO | WO-2018220084 A1 * | 12/2018 ......... | H04B 17/3911 |
| WO | PCT/EP2021/072016 | 8/2021 | |
| WO | PCT/US2022/023858 | 4/2022 | |

OTHER PUBLICATIONS

U.S. Appl. No. 63/275,709.
U.S. Appl. No. 63/312,258.

* cited by examiner

*Primary Examiner* — Ayodeji O Ayotunde
(74) *Attorney, Agent, or Firm* — Harness, Dickey & Pierce, P.L.C.

(57) ABSTRACT

A method for performing over the air (OTA) testing of a UE in a testing chamber including at least one probe antenna includes generating a first emulated downlink (DL) signal of a first virtual transmission/reception point (TRP) located at a first virtual location and a second emulated DL signal of a second virtual TRP located at a second virtual location in accordance with a first signal alternation profile and a second signal alternation profile, respectively, the first signal alternation profile including one or more first alternation characteristics that vary over time with simulated movement of the UE relative to the first virtual location, the second signal alternation profile including one or more second alternation characteristics that vary over time with simulated movement of the UE relative to the second virtual location; and transmitting signals for testing the UE based on the first and second emulated DL signals.

6 Claims, 19 Drawing Sheets

5000

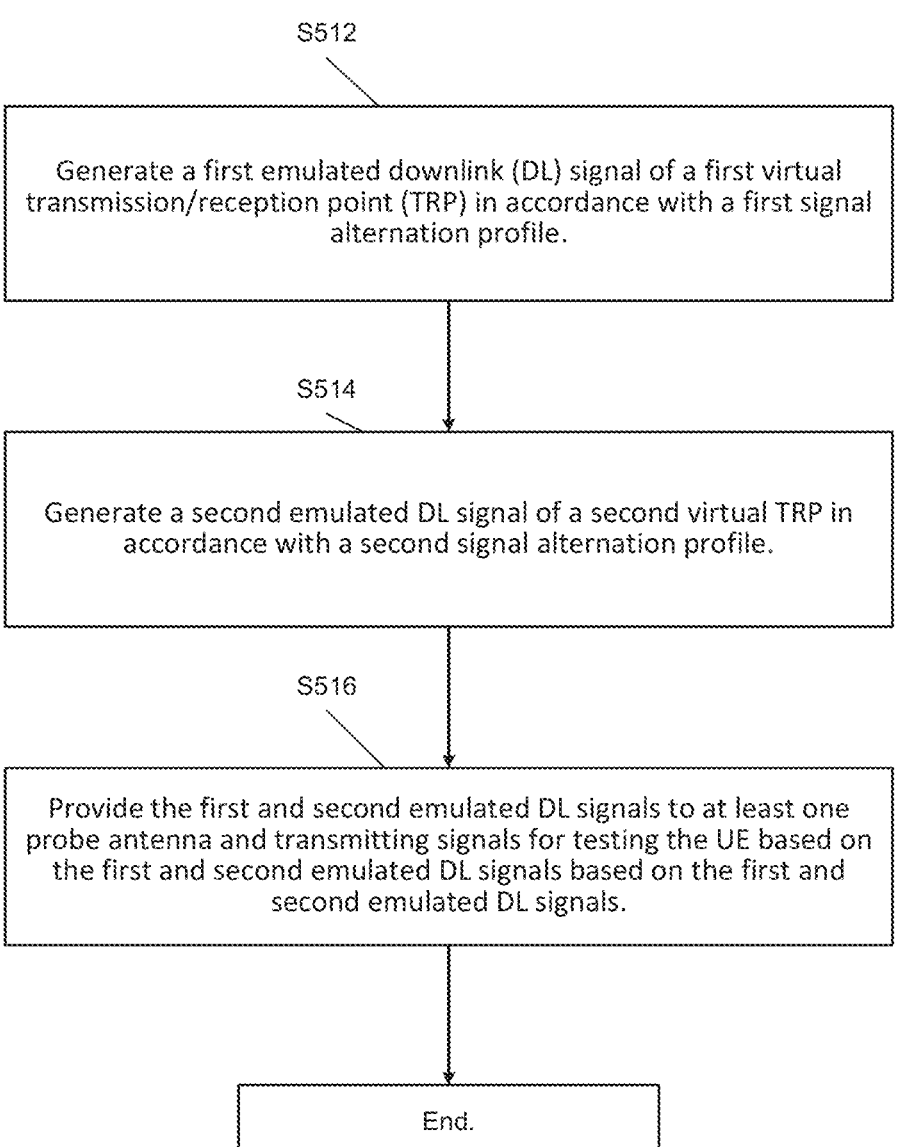

S512

Generate a first emulated downlink (DL) signal of a first virtual transmission/reception point (TRP) in accordance with a first signal alternation profile.

S514

Generate a second emulated DL signal of a second virtual TRP in accordance with a second signal alternation profile.

S516

Provide the first and second emulated DL signals to at least one probe antenna and transmitting signals for testing the UE based on the first and second emulated DL signals based on the first and second emulated DL signals.

End.

FIG. 5B

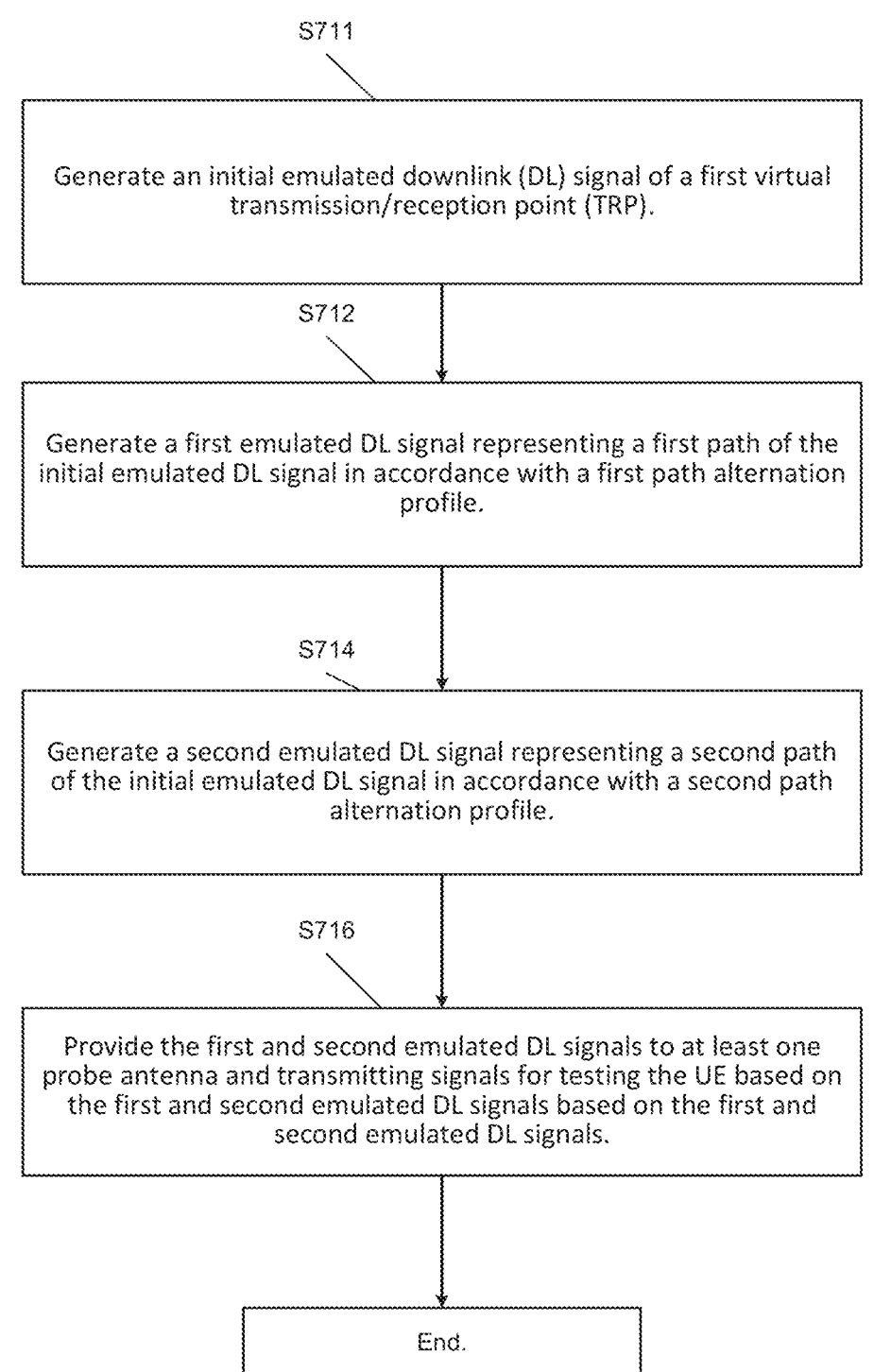

S711

Generate an initial emulated downlink (DL) signal of a first virtual transmission/reception point (TRP).

S712

Generate a first emulated DL signal representing a first path of the initial emulated DL signal in accordance with a first path alternation profile.

S714

Generate a second emulated DL signal representing a second path of the initial emulated DL signal in accordance with a second path alternation profile.

S716

Provide the first and second emulated DL signals to at least one probe antenna and transmitting signals for testing the UE based on the first and second emulated DL signals based on the first and second emulated DL signals.

End.

FIG. 7B

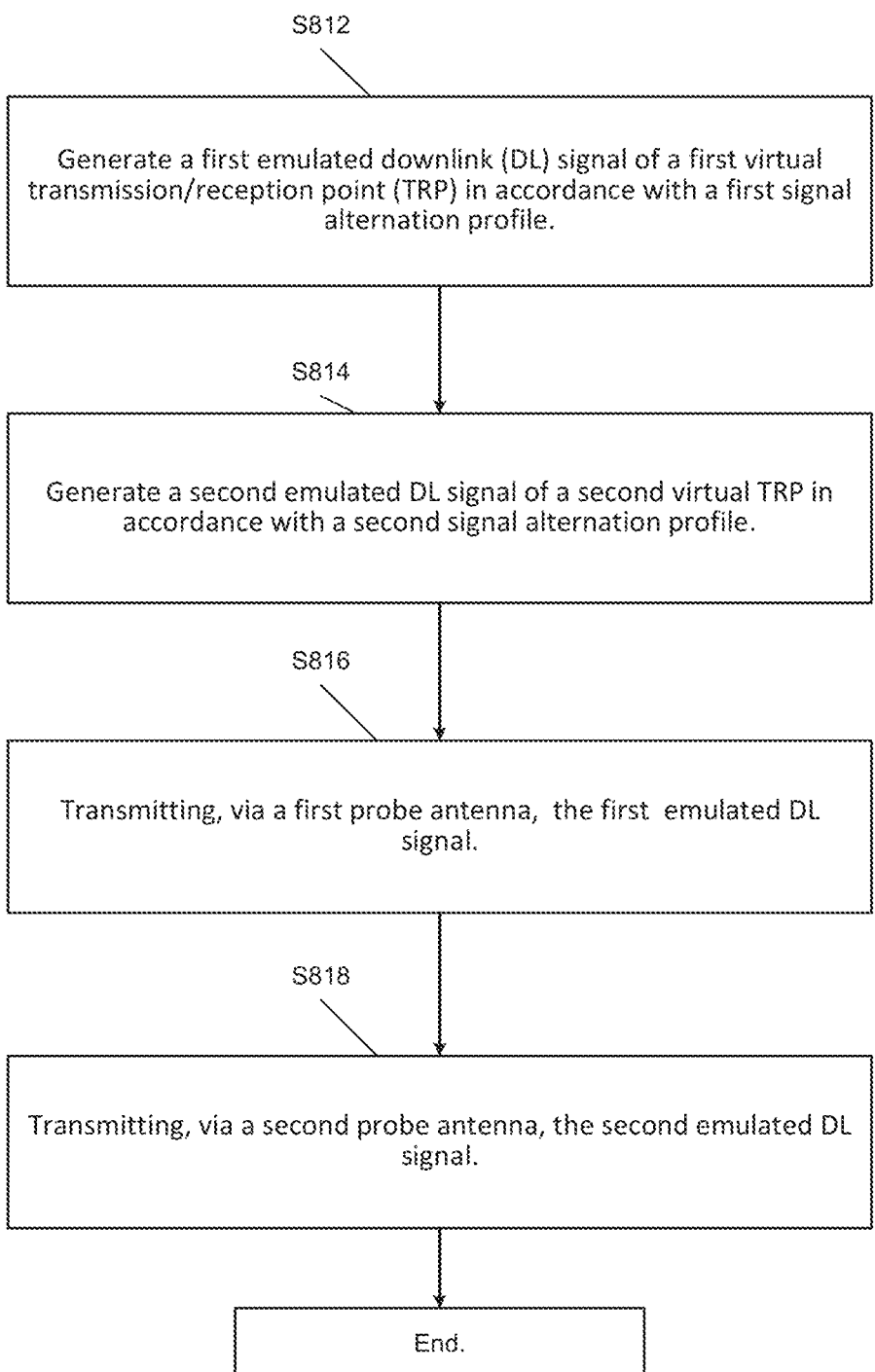

S812

Generate a first emulated downlink (DL) signal of a first virtual transmission/reception point (TRP) in accordance with a first signal alternation profile.

S814

Generate a second emulated DL signal of a second virtual TRP in accordance with a second signal alternation profile.

S816

Transmitting, via a first probe antenna, the first emulated DL signal.

S818

Transmitting, via a second probe antenna, the second emulated DL signal.

End.

FIG. 8B

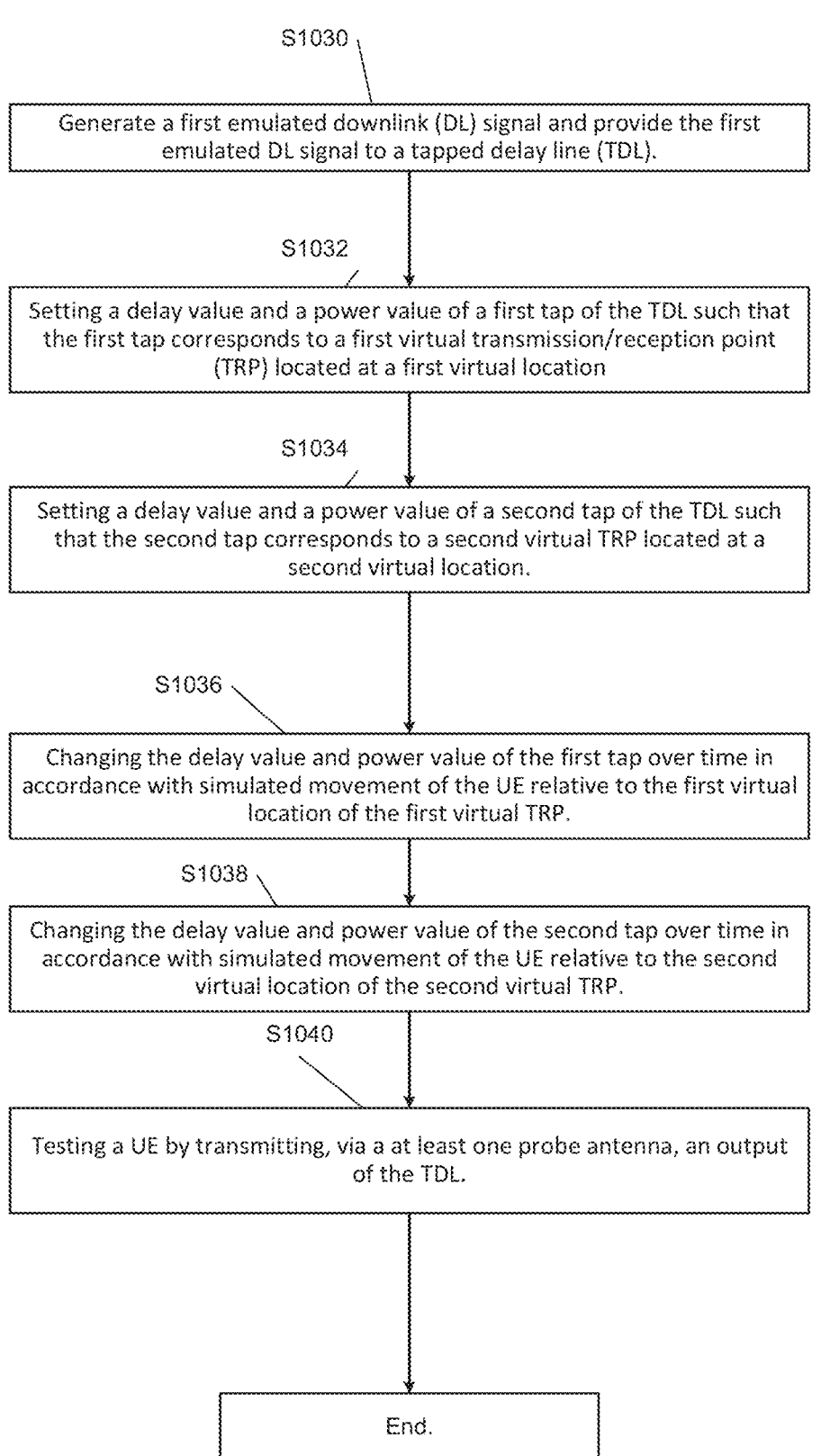

S1030

Generate a first emulated downlink (DL) signal and provide the first emulated DL signal to a tapped delay line (TDL).

S1032

Setting a delay value and a power value of a first tap of the TDL such that the first tap corresponds to a first virtual transmission/reception point (TRP) located at a first virtual location

S1034

Setting a delay value and a power value of a second tap of the TDL such that the second tap corresponds to a second virtual TRP located at a second virtual location.

S1036

Changing the delay value and power value of the first tap over time in accordance with simulated movement of the UE relative to the first virtual location of the first virtual TRP.

S1038

Changing the delay value and power value of the second tap over time in accordance with simulated movement of the UE relative to the second virtual location of the second virtual TRP.

S1040

Testing a UE by transmitting, via a at least one probe antenna, an output of the TDL.

End.

FIG. 10B

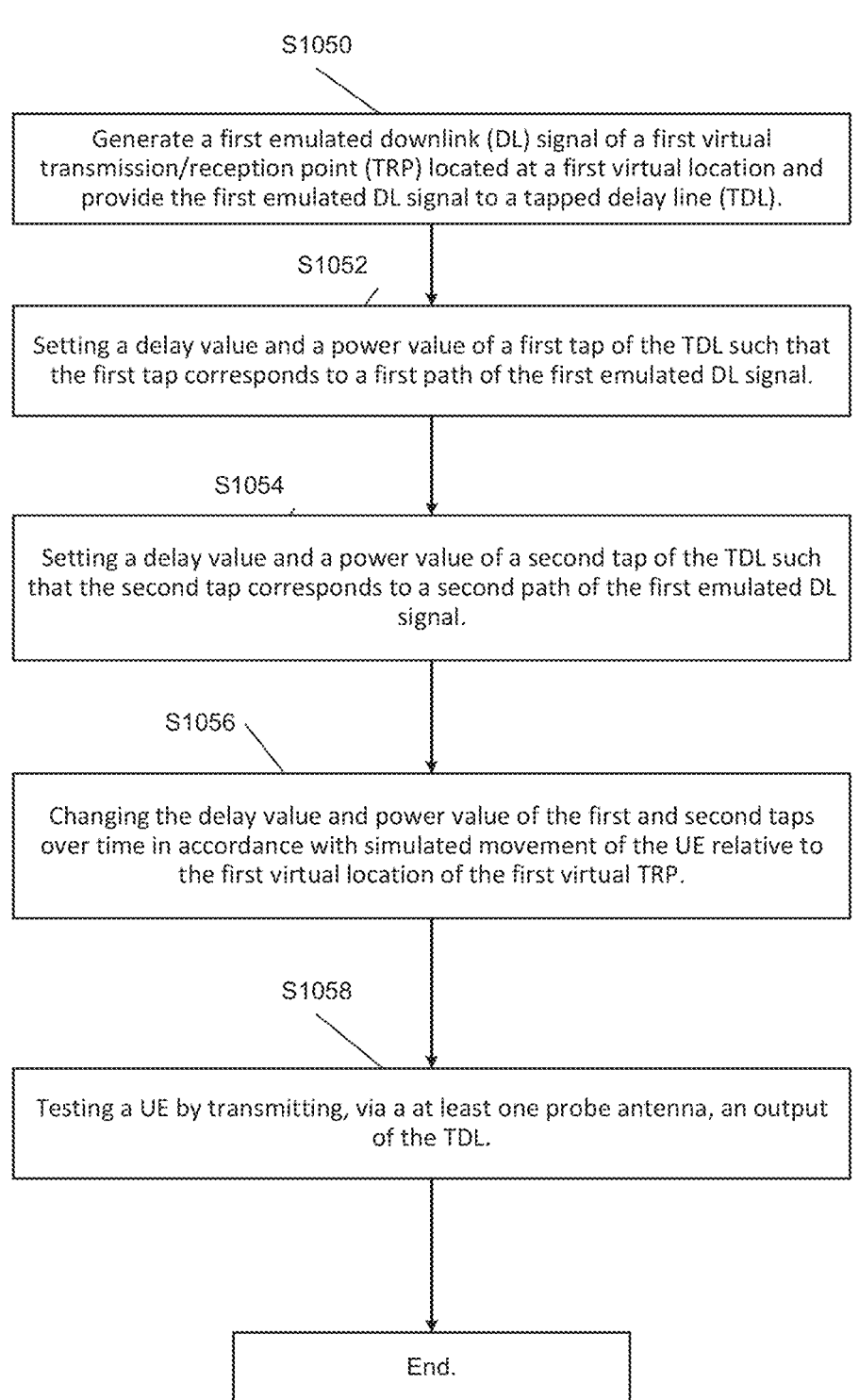

S1050

Generate a first emulated downlink (DL) signal of a first virtual transmission/reception point (TRP) located at a first virtual location and provide the first emulated DL signal to a tapped delay line (TDL).

S1052

Setting a delay value and a power value of a first tap of the TDL such that the first tap corresponds to a first path of the first emulated DL signal.

S1054

Setting a delay value and a power value of a second tap of the TDL such that the second tap corresponds to a second path of the first emulated DL signal.

S1056

Changing the delay value and power value of the first and second taps over time in accordance with simulated movement of the UE relative to the first virtual location of the first virtual TRP.

S1058

Testing a UE by transmitting, via a at least one probe antenna, an output of the TDL.

End.

FIG. 10C

METHOD AND APPARATUS FOR TESTING DYNAMIC BEAM ADAPTIVE RADIO RESOURCE MANAGEMENT (RRM) AND DEMODULATION REQUIREMENTS IN OVER THE AIR (OTA) TEST SETUP

TECHNICAL FIELD

One or more example embodiments relate generally to wireless communications and, more specifically, to facilitating positioning in Third Generation Partnership Project (3GPP) Fifth Generation (5G) New Radio (NR) networks.

BACKGROUND

Fifth generation (5G) wireless communications networks are the next generation of mobile communications networks. Standards for 5G communications networks are currently being developed by the Third Generation Partnership Project (3GPP). These standards are known as 3GPP New Radio (NR) standards. One area of development in 3GPP New Radio (NR) technology is over the air (OTA) testing environments.

SUMMARY

According to at least some example embodiments, a method for performing over the air (OTA) testing of a user equipment (UE) in a testing chamber, the testing chamber including at least one probe antenna, includes generating a first emulated downlink (DL) signal of a first virtual transmission/reception point (TRP) in accordance with a first signal alternation profile, the first signal alternation profile including one or more first alternation characteristics that vary over time in accordance with simulated movement of the UE relative to a first virtual location, the first virtual location being a location of the first virtual TRP; generating a second emulated DL signal a second virtual TRP in accordance with a second signal alternation profile, the second signal alternation profile including one or more second alternation characteristics that vary over time in accordance with simulated movement of the UE relative to a second virtual location, the second virtual location being a location of the second virtual TRP; providing the first and second emulated DL signals to the at least one probe antenna; and transmitting, by the at least one probe, signals for testing the UE based on the first and second emulated DL signals.

The providing may include generating a combined emulated DL signal by summing, by a summation circuit, the first and second emulated DL signals; and providing the combined emulated DL signal to the at least one probe antenna, and the transmitting may include transmitting, by the at least one probe antenna, the combined emulated DL signal to the UE.

The providing may include generating a combined emulated DL signal by multiplexing, by a switch circuit, the first and second emulated DL signals in the time domain; and providing the combined emulated DL signal to the at least one probe antenna, and the transmitting may include transmitting, by the at least one probe antenna, the combined emulated DL signal to the UE.

The one or more first alternation characteristics that vary over time may include at least one of signal power attenuation, signal delay, signal frequency offset, or signal phase, and the one or more second alternation characteristics that vary over time may include at least one of signal power attenuation, signal delay, signal frequency offset, or signal phase.

The at least one probe antenna may include a first probe antenna located on a first side of the UE in the test chamber and a second probe antenna located on a second side of the UE in the test chamber, the providing of the first and second emulated DL signals may include providing the first and second emulated DL to the first probe antenna, the transmitting may include transmitting, by the first probe, signals for testing the UE based on the first and second emulated DL signals, and the method may further include generating a third emulated DL signal of a third virtual TRP in accordance with a third signal alternation profile, the third signal alternation profile including one or more third alternation characteristics that vary over time in accordance with simulated movement of the UE relative to a third virtual location, the third virtual location being a location of the third virtual TRP; generating a fourth emulated DL signal of a fourth virtual TRP in accordance with a fourth signal alternation profile, the fourth signal alternation profile including one or more fourth alternation characteristics that vary over time in accordance with simulated movement of the UE relative to a fourth virtual location, the fourth virtual location being a location of the fourth virtual TRP; providing the third and fourth emulated DL signals to the second probe antenna; and transmitting, by the second probe antenna, signals for testing the UE based on the third and fourth emulated DL signals.

The at least one probe antenna may include a first probe antenna located on a first side of the UE in the test chamber and a second probe antenna located on a second side of the UE in the test chamber, wherein the providing of the first and second emulated DL signals includes providing the first and second emulated DL to the first probe antenna, wherein the transmitting includes transmitting, by the first probe, signals for testing the UE based on the first and second emulated DL signals, and wherein the method further includes generating a third emulated DL signal of a third virtual TRP in accordance with a third signal alternation profile, the third signal alternation profile including one or more third alternation characteristics that vary over time in accordance with simulated movement of the UE relative to a third virtual location, the third virtual location being a location of the third virtual TRP; and testing the UE by transmitting, by the second probe antenna, the third emulated DL signals.

According to at least some example embodiments, a method for performing over the air (OTA) testing of a user equipment (UE) in a testing chamber, the testing chamber including at least first and second probe antennas, includes generating a first emulated downlink (DL) signal of a first virtual transmission/reception point (TRP) in accordance with a first signal alternation profile, the first signal alternation profile including one or more first alternation characteristics that vary over time in accordance with simulated movement of the UE relative to a first virtual location, the first virtual location being a location of the first virtual TRP; generating a second emulated DL signal of a second virtual TRP in accordance with a second signal alternation profile, the second signal alternation profile including one or more second alternation characteristics that vary over time in accordance with simulated movement of the UE relative to a second virtual location, the second virtual location being a location of the second virtual TRP; and testing the UE by, transmitting, via the first probe antenna, the first emulated DL signals, and transmitting, via the second probe antenna, the second emulated DL signals.

The one or more first alternation characteristics that vary over time may include at least one of signal power attenuation, signal delay, signal frequency offset, or signal phase, and the one or more second alternation characteristics that vary over time may include at least one of signal power attenuation, signal delay, signal frequency offset, or signal phase.

According to at least some example embodiments, a method for performing over the air (OTA) testing of a user equipment (UE) in a testing chamber, the testing chamber including at least one probe antenna, includes generating a first emulated downlink (DL) signal; providing the first emulated DL signal to a tapped delay line (TDL); setting a delay value and a power value of a first tap of the TDL such that the first tap corresponds to a first virtual transmission/reception point (TRP) located at a first virtual location; setting a delay value and a power value of a second tap of the TDL such that the second tap corresponds to a second virtual TRP located at a second virtual location; changing the delay value and power value of the first tap over time in accordance with simulated movement of the UE relative to the first virtual location of the first virtual TRP; changing the delay value and power value of the second tap over time in accordance with simulated movement of the UE relative to the second virtual location of the second virtual TRP; and testing the UE by transmitting, via the at least one probe antenna, an output of the TDL.

According to at least some example embodiments, a method for performing over the air (OTA) testing of a user equipment (UE) in a testing chamber, the testing chamber including at least one probe antenna, includes generating an initial emulated downlink (DL) signal of a first virtual transmission/reception point (TRP); generating a first emulated DL signal representing a first path of the initial emulated DL signal in accordance with a first path alternation profile, the first path alternation profile including one or more first alternation characteristics that vary over time in accordance with simulated movement of the UE relative to a first virtual location, the first virtual location being a location of the first virtual TRP; generating a second emulated DL signal representing a second path of the initial emulated DL signal in accordance with a second path alternation profile, the second path alternation profile including one or more second alternation characteristics that vary over time in accordance with simulated movement of the UE relative to the first virtual location; providing the first and second emulated DL signals to the at least one probe antenna; and transmitting, by the at least one probe, signals for testing the UE based on the first and second emulated DL signals.

According to at least some example embodiments, a method for performing over the air (OTA) testing of a user equipment (UE) in a testing chamber, the testing chamber including at least one probe antenna includes generating a first emulated downlink (DL) signal of a first virtual transmission/reception point (TRP) located at a first virtual location; providing the first emulated DL signal to a tapped delay line (TDL); setting a delay value and a power value of a first tap of the TDL such that the first tap corresponds to a first path of the first emulated DL signal; setting a delay value and a power value of a second tap of the TDL such that the second tap corresponds to a second path of the first emulated DL signal; changing the delay value and power value of the first and second taps over time in accordance with simulated movement of the UE relative to the first virtual location of the first virtual TRP; and testing the UE by transmitting, via the at least one probe antenna, an output of the TDL.

According to at least some example embodiments, a testing system for performing over the air (OTA) testing of a user equipment (UE) in a testing chamber including at least one probe antenna, includes testing equipment including a network emulator and a channel emulator, wherein the network emulator is configured to emulate initial emulated downlink (DL) signals of a first virtual transmission/reception point (TRP) and a second virtual TRP, respectively, wherein the channel emulator is configured to generate, based on the initial emulated DL signals, a first emulated DL signal of a first virtual TRP in accordance with a first signal alternation profile and a second emulated DL signal of a second virtual TRP in accordance with a second signal alternation profile, the first signal alternation profile including one or more first alternation characteristics that vary over time in accordance with simulated movement of the UE relative to a first virtual location, the first virtual location being a location of the first virtual TRP, the second signal alternation profile including one or more second alternation characteristics that vary over time in accordance with simulated movement of the UE relative to a second virtual location, the second virtual location being a location of the second virtual TRP, and wherein the testing equipment is configured to transmit, via the at least one probe antenna, signals for testing the UE based on the first and second emulated DL signals.

The channel emulator may include a combining block configured to generate a combined emulated DL signal by summing, by a summation circuit, the first and second emulated DL signals, and provide the first and second emulated DL signals to the at least one probe antenna by providing the combined emulated DL signal to the at least one probe antenna.

The channel emulator may include a combining block configured to generate a combined emulated DL signal by multiplexing, by a switch circuit included in the combining block, the first and second emulated DL signals in the time domain, and provide the first and second emulated DL signals to the at least one probe antenna by providing the combined emulated DL signal to the at least one probe antenna.

The one or more first alternation characteristics that vary over time may include at least one of signal power attenuation, signal delay, signal frequency offset, or signal phase, and the one or more second alternation characteristics that vary over time may include at least one of signal power attenuation, signal delay, signal frequency offset, or signal phase.

The testing system may further include the at least one probe antenna, wherein the at least one probe antenna includes a first probe antenna located on a first side of the UE in the test chamber and a second probe antenna located on a second side of the UE in the test chamber, wherein the channel emulator is further configured to transmit, via the first probe antenna, the signals for testing the UE based on the first and second emulated DL signals, wherein the network emulator is further configured to emulate initial emulated DL signals of a third virtual TRP and a fourth virtual TRP, respectively, and wherein the channel emulator is further configured to generate a third emulated DL signal of a third virtual TRP in accordance with a third signal alternation profile, the third signal alternation profile including one or more third alternation characteristics that vary over time in accordance with simulated movement of the UE relative to a third virtual location, the third virtual location being a location of the third virtual TRP, generate a fourth emulated DL signal of a fourth virtual TRP in accordance with a fourth signal alternation profile, the fourth signal alternation profile including one or more fourth alternation characteristics that vary over time in accordance with simulated movement of the UE relative to a fourth virtual location, the fourth virtual location being a location of the fourth virtual TRP, and transmit, via the second probe antenna, signals for testing the UE based on the third and fourth emulated DL signals.

The testing system may further include the at least one probe antenna, the at least one probe antenna may include a first probe antenna located on a first side of the UE in the test chamber and a second probe antenna located on a second side of the UE in the test chamber, the channel emulator may be further configured to transmit, via the first probe antenna, the signals for testing the UE based on the first and second emulated DL signals, the network emulator may be further configured to emulate an initial emulated DL signal of a third virtual TRP, the channel emulator may be further configured to generate a third emulated DL signal of a third virtual TRP in accordance with a third signal alternation profile, the third signal alternation profile including one or more third alternation characteristics that vary over time in accordance with simulated movement of the UE relative to a third virtual location, the third virtual location being a location of the third virtual TRP, and the testing equipment may be configured to transmit, via the second probe antenna, signals for testing the UE based on the third emulated DL signal.

According to at least some example embodiments, a testing system for performing over the air (OTA) testing of a user equipment (UE) in a testing chamber, the testing chamber including at least first and second probe antennas, includes testing equipment including a network emulator and a channel emulator, wherein the network emulator is configured to emulate initial emulated downlink (DL) signals of a first virtual transmission/reception point (TRP) and a second virtual TRP, respectively, wherein the channel emulator is configured to generate, based on the emulated initial DL signals, a first emulated DL signal of a first virtual TRP in accordance with a first signal alternation profile and a second emulated DL signal a second virtual TRP in accordance with a second signal alternation profile, the first signal alternation profile including one or more first alternation characteristics that vary over time in accordance with simulated movement of the UE relative to a first virtual location, the first virtual location being a location of the first virtual TRP, the second signal alternation profile including one or more second alternation characteristics that vary over time in accordance with simulated movement of the UE relative to a second virtual location, the second virtual location being a location of the second virtual TRP, and wherein the testing equipment is configured to test the UE by transmitting, via the first probe antenna, the first emulated DL signals, and transmitting, via the second probe antenna, the second emulated DL signals.

The one or more first alternation characteristics that vary over time may include at least one of signal power attenuation, signal delay, signal frequency offset, or signal phase, and the one or more second alternation characteristics that vary over time may include at least one of signal power attenuation, signal delay, signal frequency offset, or signal phase.

According to at least some example embodiments, a testing system for performing over the air (OTA) testing of a user equipment (UE) in a testing chamber, the testing chamber including at least one probe antenna, includes testing equipment including a network emulator and a channel emulator, wherein the channel emulator includes a tapped delay line (TDL), wherein the network emulator is configured to generate a first emulated downlink (DL) signal and provide the first emulated DL signal to the TDL, wherein the channel emulator is configured to, set a delay value and a power value of a first tap of the TDL such that the first tap corresponds to a first virtual transmission/ reception point (TRP) located at a first virtual location, set a delay value and a power value of a second tap of the TDL such that the second tap corresponds to a second virtual TRP located at a second virtual location, change the delay value and power value of the first tap over time in accordance with simulated movement of the UE relative to the first virtual location of the first virtual TRP, and change the delay value and power value of the second tap over time in accordance with simulated movement of the UE relative to the second virtual location of the second virtual TRP, and wherein the testing equipment is configured to test the UE by transmitting, via the at least one probe antenna, an output of the TDL.

According to at least some example embodiments, a testing system for performing over the air (OTA) testing of a user equipment (UE) in a testing chamber, the testing chamber including at least one probe antenna, includes testing equipment including a network emulator and a channel emulator, wherein the network emulator is configured to emulate an initial emulated downlink (DL) signal of a first virtual transmission/reception point (TRP), wherein the channel emulator is configured to, generate, based on the initial emulated DL signal, a first emulated DL signal representing a first path of the initial emulated DL signal in accordance with a first path alternation profile, the first path alternation profile including one or more first alternation characteristics that vary over time in accordance with simulated movement of the UE relative to a first virtual location, the first virtual location being a location of the first virtual TRP, and generate, based on the initial emulated DL signal, a second emulated DL signal representing a second path of the initial emulated DL signal in accordance with a second path alternation profile, the second path alternation profile including one or more second alternation characteristics that vary over time in accordance with simulated movement of the UE relative to the first virtual location, and wherein the testing equipment is configured to transmit, via the at least one probe antenna, signals for testing the UE based on the first and second emulated DL signals.

According to at least some example embodiments, a testing system for performing over the air (OTA) testing of a user equipment (UE) in a testing chamber, the testing chamber including at least one probe antenna, includes testing equipment including a network emulator and a channel emulator, wherein the channel emulator includes a tapped delay line (TDL), wherein the network emulator is configured to generate a first emulated downlink (DL) signal of a first virtual transmission/reception point (TRP) located at a first virtual location and provide the first emulated DL signal to the TDL, wherein the channel emulator is configured to set a delay value and a power value of a first tap of the TDL such that the first tap corresponds to a first path of the first emulated DL signal, set a delay value and a power value of a second tap of the TDL such that the second tap corresponds to a second path of the first emulated DL signal, and change the delay value and power value of the first and second taps over time in accordance with simulated movement of the UE relative to the first virtual location of the first virtual TRP, and wherein the testing equipment is configured to test the UE by transmitting, via the at least one probe antenna, an output of the TDL.

According to at least some example embodiments, a testing system for performing over the air (OTA) testing of a user equipment (UE) in a testing chamber, the testing chamber including at least one probe antenna, includes first signal generating means for generating a first emulated downlink (DL) signal of a first virtual transmission/reception point (TRP) in accordance with a first signal alternation profile, the first signal alternation profile including one or more first alternation characteristics that vary over time in accordance with simulated movement of the UE relative to a first virtual location, the first virtual location being a location of the first virtual TRP; second signal generating means for generating a second emulated DL signal a second virtual TRP in accordance with a second signal alternation profile, the second signal alternation profile including one or more second alternation characteristics that vary over time in accordance with simulated movement of the UE relative to a second virtual location, the second virtual location being a location of the second virtual TRP; means for providing the first and second emulated DL signals to the at least one probe antenna; and means for transmitting, by the at least one probe, signals for testing the UE based on the first and second emulated DL signals.

According to at least some example embodiments, a testing system for performing over the air (OTA) testing of a user equipment (UE) in a testing chamber, the testing chamber including at least first and second probe antennas, includes first signal generating means for generating a first emulated downlink (DL) signal of a first virtual transmission/reception point (TRP) in accordance with a first signal alternation profile, the first signal alternation profile including one or more first alternation characteristics that vary over time in accordance with simulated movement of the UE relative to a first virtual location, the first virtual location being a location of the first virtual TRP; second signal generating means for generating a second emulated DL signal of a second virtual TRP in accordance with a second signal alternation profile, the second signal alternation profile including one or more second alternation characteristics that vary over time in accordance with simulated movement of the UE relative to a second virtual location, the second virtual location being a location of the second virtual TRP; and means for testing the UE by, transmitting, via the first probe antenna, the first emulated DL signals, and transmitting, via the second probe antenna, the second emulated DL signals. According to at least some example embodiments, a testing system for performing over the air (OTA) testing of a user equipment (UE) in a testing chamber, the testing chamber including at least one probe antenna, includes first signal generating means for generating a first emulated downlink (DL) signal; means for providing the first emulated DL signal to a tapped delay line (TDL); first setting means for setting a delay value and a power value of a first tap of the TDL such that the first tap corresponds to a first virtual transmission/reception point (TRP) located at a first virtual location; second setting means for means for setting a delay value and a power value of a second tap of the TDL such that the second tap corresponds to a second virtual TRP located at a second virtual location; first changing means for changing the delay value and power value of the first tap over time in accordance with simulated movement of the UE relative to the first virtual location of the first virtual TRP; second changing means for changing the delay value and power value of the second tap over time in accordance with simulated movement of the UE relative to the second virtual location of the second virtual TRP; and means for testing the UE by transmitting, via the at least one probe antenna, an output of the TDL.

According to at least some example embodiments, a testing system for performing over the air (OTA) testing of a user equipment (UE) in a testing chamber, the testing chamber including at least one probe antenna, includes initial signal generating means for generating an initial emulated downlink (DL) signal of a first virtual transmission/reception point (TRP); first signal generating means for generating a first emulated DL signal representing a first path of the initial emulated DL signal in accordance with a first path alternation profile, the first path alternation profile including one or more first alternation characteristics that vary over time in accordance with simulated movement of the UE relative to a first virtual location, the first virtual location being a location of the first virtual TRP; second signal generating means for generating a second emulated DL signal representing a second path of the initial emulated DL signal in accordance with a second path alternation profile, the second path alternation profile including one or more second alternation characteristics that vary over time in accordance with simulated movement of the UE relative to the first virtual location; means for providing the first and second emulated DL signals to the at least one probe antenna; and transmitting means for transmitting, by the at least one probe, signals for testing the UE based on the first and second emulated DL signals.

According to at least some example embodiments, a testing system for performing over the air (OTA) testing of a user equipment (UE) in a testing chamber, the testing chamber including at least one probe antenna, includes means for generating a first emulated downlink (DL) signal of a first virtual transmission/reception point (TRP) located at a first virtual location; means for providing the first emulated DL signal to a tapped delay line (TDL); means for setting a delay value and a power value of a first tap of the TDL such that the first tap corresponds to a first path of the first emulated DL signal; means for setting a delay value and a power value of a second tap of the TDL such that the second tap corresponds to a second path of the first emulated DL signal; means for changing the delay value and power value of the first and second taps over time in accordance with simulated movement of the UE relative to the first virtual location of the first virtual TRP; and means for testing the UE by transmitting, via the at least one probe antenna, an output of the TDL.

BRIEF DESCRIPTION OF THE DRAWINGS

Example embodiments will become more fully understood from the detailed description given herein below and the accompanying drawings, wherein like elements are represented by like reference numerals, which are given by way of illustration only and thus are not limiting of this disclosure.

FIG. 5B is a flowchart illustrating a method for performing over the air (OTA) testing of a UE in a testing chamber that includes at least one probe antenna, using signal alternation profiles.

FIG. 7B is a flowchart illustrating a method for performing over the air (OTA) testing of a UE in a testing chamber that includes at least one probe antenna, using path alternation profiles.

FIG. 8B is a flowchart illustrating a method for performing over the air (OTA) testing of a UE in a testing chamber that includes at least two probe antennas.

FIG. 10B is a flowchart illustrating a method for performing OTA testing of a UE in a testing chamber that includes at least one probe antenna using a tapped delay line (TDL), using signal alternation profiles.

FIG. 10C is a flowchart illustrating a method for performing OTA testing of a UE in a testing chamber that includes at least one probe antenna using a tapped delay line (TDL), using path alternation profiles.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. The use of similar or identical reference numbers in the various drawings is intended to indicate the presence of a similar or identical element or feature.

DETAILED DESCRIPTION

Various example embodiments will now be described more fully with reference to the accompanying drawings in which some example embodiments are shown.

Detailed illustrative embodiments are disclosed herein. However, specific structural and functional details disclosed herein are merely representative for purposes of describing example embodiments. The example embodiments may, however, be embodied in many alternate forms and should not be construed as limited to only the embodiments set forth herein.

It should be understood that there is no intent to limit example embodiments to the particular forms disclosed. On the contrary, example embodiments are to cover all modifications, equivalents, and alternatives falling within the scope of this disclosure. Like numbers refer to like elements throughout the description of the figures.

Figure 1A:
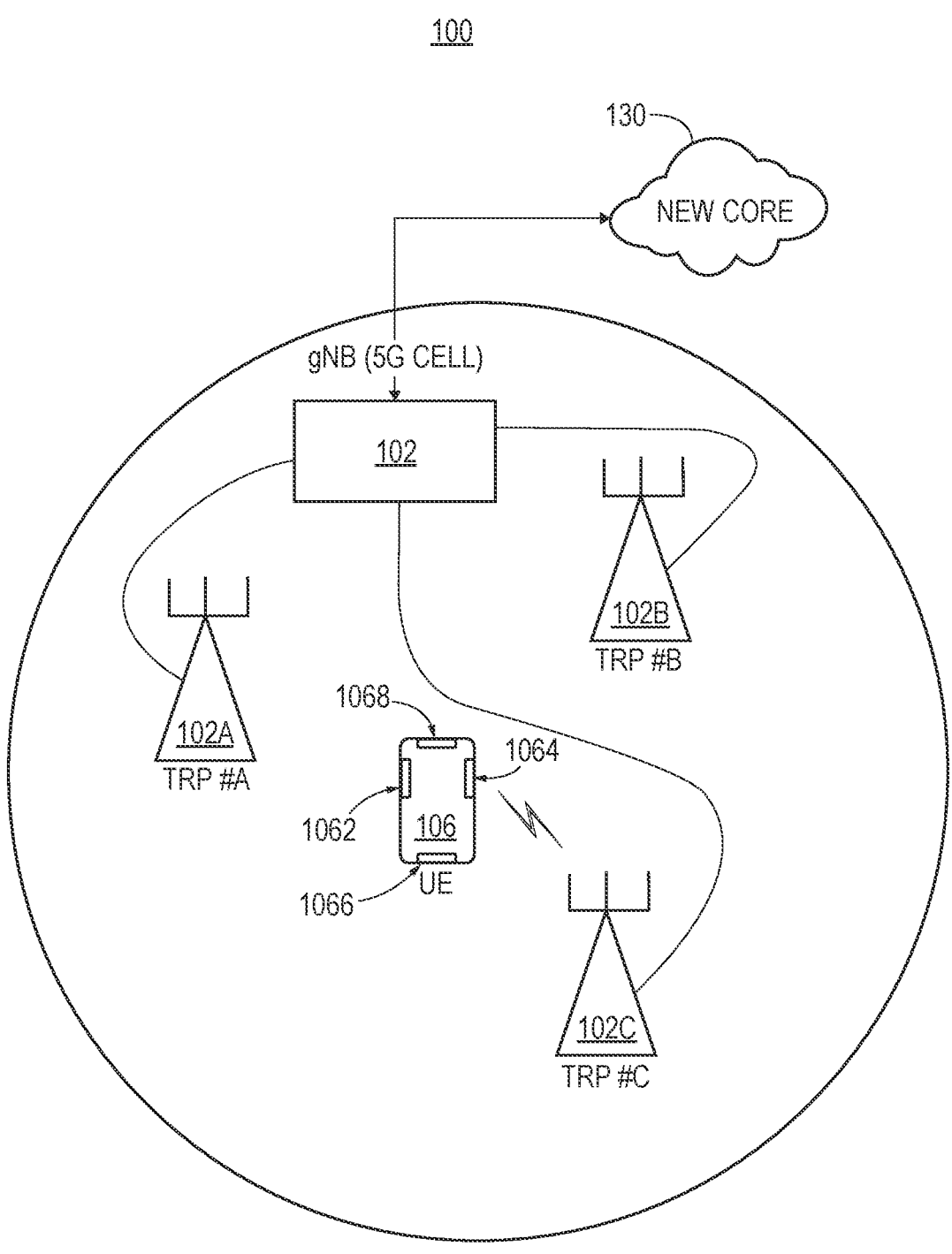
FIG. 1A is a diagram illustrating a portion of a wireless communications system according to at least some example embodiments.

FIG. 1A illustrates a simplified diagram of a portion of a 3rd Generation Partnership Project (3GPP) New Radio (NR) access deployment for explaining example embodiments in more detail.

Referring to FIG. 1A, wireless communications system 100 is an example of a 3GPP NR radio access deployment includes a gNB 102 having transmission and reception points (TRPs) 102A, 102B, 102C. Each TRP 102A, 102B, 102C may be, for example, a remote radio head (RRH) or remote radio unit (RRU) including at least, for example, a radio frequency (RF) antenna (or antennas) or antenna panels, and a radio transceiver, for transmitting and receiving data within a geographical area. In this regard, the TRPs 102A, 102B, 102C provide cellular resources for user equipment (UEs) (e.g., UE 106) within a geographical coverage area. In some cases, baseband processing may be divided between the TRPs 102A, 102B, 102C and gNB 102 in a 5th Generation (5G) cell. Alternatively, the baseband processing may be performed at the gNB 102. In the example shown in FIG. 1, the TRPs 102A, 102B, 102C are configured to communicate with UE 106 via one or more transmit (TX)/ receive (RX) beam pairs. The gNB 102 communicates with the core network (CN) 130, which is referred to as the New Core or 5G core (5GC) in 3GPP NR. In the present disclosure, a transmission and reception point may also be referred to as a transmission/reception point and may be abbreviated as TRP or TRxP.

The TRPs 102A, 102B, 102C may have independent schedulers, or the gNB 102 may perform joint scheduling among the TRPs 102A, 102B, 102C.

Although only a single UE 106 is shown in FIG. 1A, the gNB 102 and TRPs 102A, 102B, 102C may provide communication services to a relatively large number of UEs within the coverage area of the TRPs 102A, 102B, 102C. For the sake of clarity of example embodiments, communication services (including transmitting and receiving wireless signals) will be discussed as between the gNB 102 and the UE 106. It should be understood, however, that signals may be transmitted between the UE 106 and one or more of the TRPs 102A, 102B, 102C.

The UE 106 includes a plurality of panels 1062, 1064, 1066 and 1068 for transmitting and receiving data to and from the gNB 102 on the UL and DL. Although only four antenna panels are shown in FIG. 1A, example embodiments should not be limited to this example. Example functionality and operation of the UE 106 will be discussed in more detail below. Examples of the UE 106 include, but are not limited to, a mobile device, a tablet, a laptop computer, a wearable device, an Internet of Things (IoT) device, a desktop computer and/or any other type of stationary or portable device capable of operating according to the 5G NR communication standard, and/or other wireless communication standard. In the example illustrated in FIG. 1, the UE 106 is a mobile device.

According to at least some example embodiments, the wireless communications system 100 is not limited to the elements illustrated in FIG. 1A and the wireless communications system 100 may include numbers of constituent elements different than those shown in FIG. 1. For example, the wireless communications system 100 may include any number of UE devices, any number of gNBs, etc.

Additionally, though not illustrated, the CN 130 may include a number of 5GC network elements. For example, the gNB 102 may be connected to a location management function (LMF), an access and mobility management function (AMF) element and/or a session management function (SMF) element. Additionally, though not illustrated, the wireless communications system 100 may further include long-term evolution (LTE) network elements that are connected to the gNB 102. Examples of such LTE elements include, but are not limited to, LTE radio access technology (RAT) network elements (e.g., evolved universal mobile telecommunications system (UMTS) terrestrial radio access network (E-UTRAN) network elements) such as evolved node Bs (eNBs), and LTE core network elements (e.g., evolved packet core (EPC) network elements) such as mobility management entities (MMEs). An example structure which may be used to embody one or more radio network elements (e.g., gNBs, UEs, etc.) of the wireless communications system 100 will now be discussed below with respect to FIG. 1B.

Figure 1B:
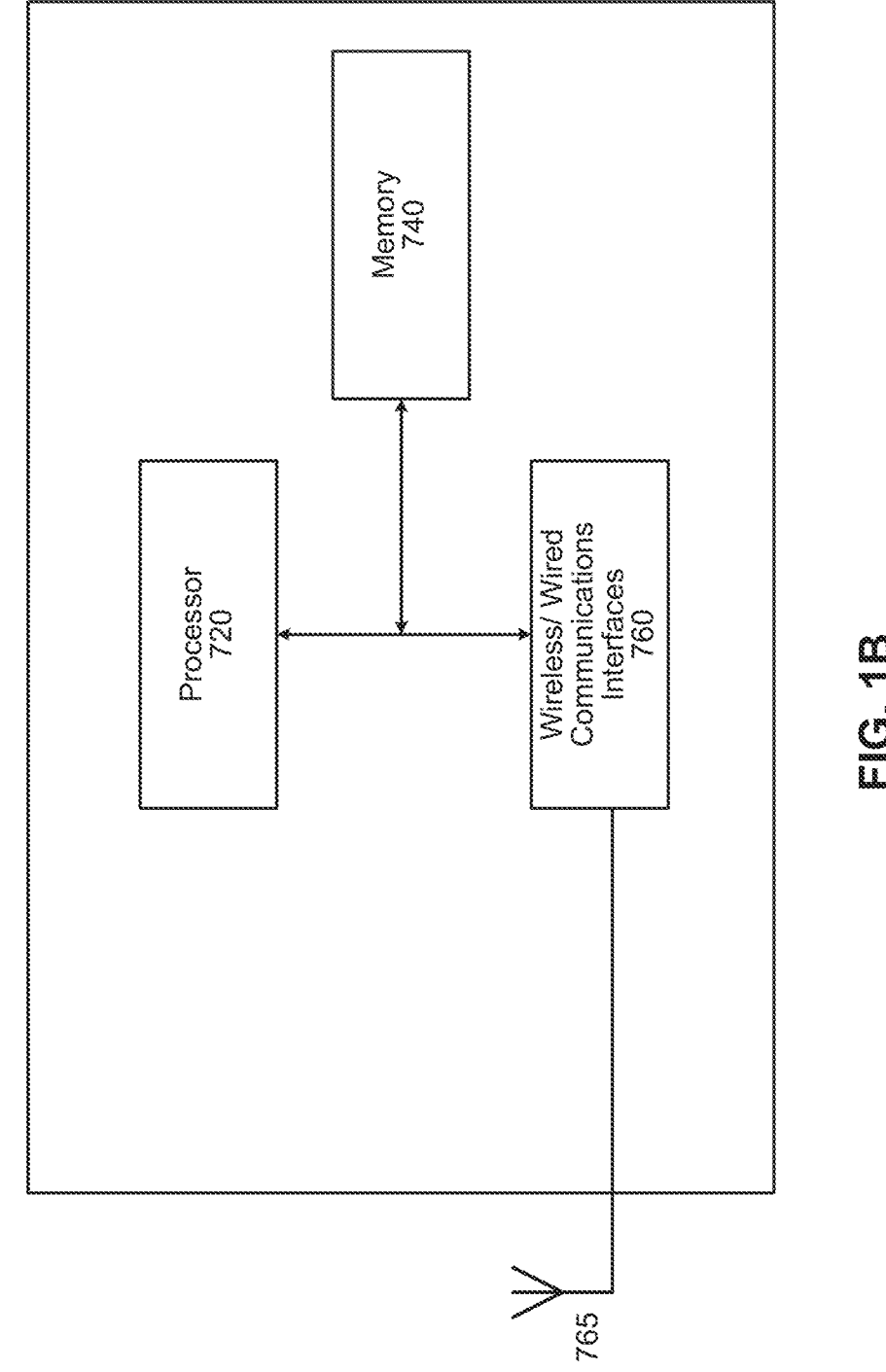
FIG. 1B illustrates a system element according to at least some example embodiments.

FIG. 1B illustrates an example embodiment of a system element. Referring to FIG. 1B, a system element 200 includes: a memory 740, a processor 720, and various communications interfaces 760 connected to each other; and one or more antennas or antenna panels 765 connected to the various communications interfaces 760. The various interfaces 760 and the antenna 765 may constitute a transceiver for transmitting/receiving data to/from a UE, a gNB, a CN node, a CN element, and/or another radio network element via one or more of a plurality of wireless beams. According to at least some example embodiments, in addition to, or alternatively, instead of, including interfaces for supporting wireless communications, various interfaces 760 may include interfaces for supporting wired communications.

As will be appreciated, depending on the implementation of the network element 200, the network element 200 may include many more components than those shown in FIG. 1B for providing the functionalities of the particular element being embodied by the system element 200 (e.g., functionalities of a UE, a CN element, a gNB, a TRP, testing equipment, etc. in accordance with one or more example embodiments). However, it is not necessary that all of these generally conventional components be shown in order to disclose the illustrative example embodiment.

The memory 740 may be a computer readable storage medium that generally includes a random access memory (RAM), read only memory (ROM), and/or a permanent mass storage device, such as a disk drive. The memory 740 also stores an operating system and any other routines/modules/applications for providing the functionalities of the particular element being embodied by the system element 200 (e.g., functionalities of a UE, a CN element and/or node, a gNB, testing equipment, etc. in accordance with one or more example embodiments) to be executed by the processor 720. These software components may also be loaded from a separate computer readable storage medium into the memory 740 using a drive mechanism (not shown). Such separate computer readable storage medium may include a disc, tape, DVD/CD-ROM drive, memory card, or other like computer readable storage medium (not shown). In some example embodiments, software components may be loaded into the memory 740 via one of the various interfaces 760, rather than via a computer readable storage medium. According to at least some example embodiments, the memory 740 may store computer-executable instructions corresponding to any or all steps discussed with reference to FIGS. 1-3.

The processor 720 may be configured to carry out instructions of a computer program by performing the arithmetical, logical, and input/output operations of the system. Instructions may be provided to the processor 720 by the memory 740.

The various interfaces 760 may include components that interface the processor 720 with the one or more antennas 765, or other input/output components. As will be understood, the various interfaces 760 and programs stored in the memory 740 to set forth the special purpose functionalities of the system element 200 will vary depending on the particular element of the wireless communications system 100 being embodied by the system element 200.

The various interfaces 760 may also include one or more user input devices (e.g., a keyboard, a keypad, a mouse, or the like) and user output devices (e.g., a display, a speaker, or the like).

Table 1, below, provides a list of a number of abbreviations which may be used in the present specification:

TABLE 1

Figure 2:
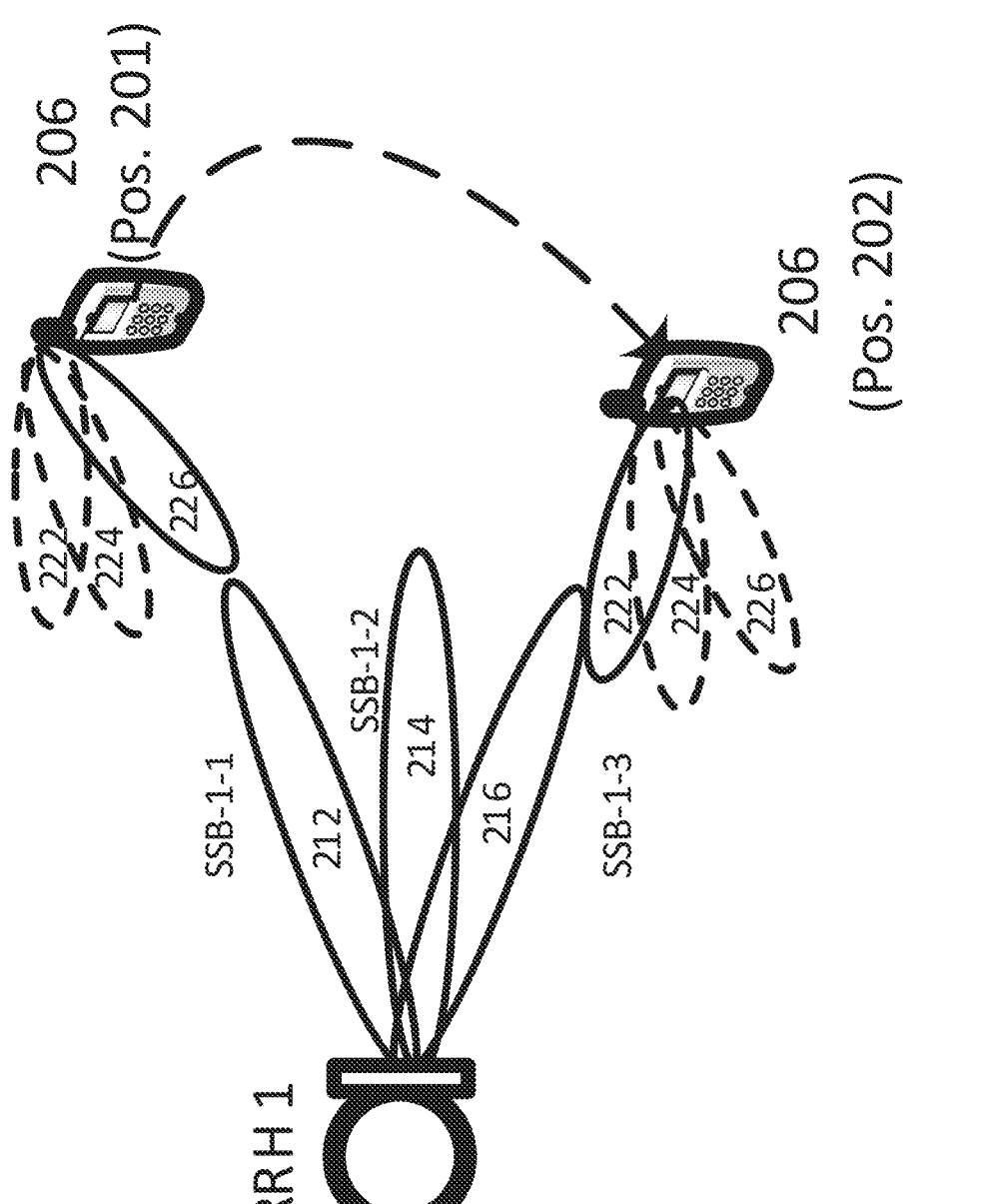
FIG. 2 is a diagram illustrating an example of a user equipment (UE) changing a serving beam when the UE moves spatially.

AoA - Angle of Arrival
AoD - Angle of Departure
AP - Access Point
AWGN - Additive white Gaussian noise
BM - Beam Management
CSI-RS - Channel State Information Reference Signal
DL - Downlink
DU - Distributed Unit
FR1/FR2 - Frequency Range 1/Frequency Range 2
HST - High-Speed Train
L1/L2/L3 - Layer 1/Layer 2/Layer 3
NR - New Radio
OTA - Over-The-Air
PCI - Physical Cell Identifier
PD - Propagation Delay
PDCCH - Physical Downlink Control Channel
PDSCH - Physical Downlink Shared Channel
RA - Random Access
RAR - RA Reply
RRH - Remote Radio Head
RRM - Radio Resource Management
RS - Reference Symbol
RSRP - Reference Signal Received Power
RU - Radio Unit
Rx - Receiving, Reception
SFN - Single Frequency Network
SID - Study Item Description
SNR - Signal to Noise Ratio
SRS - Sounding Reference Symbols TABLE 1-continued SSB - Synchronization Signal Block
TA - Timing Advance
TAC - Timing Adjustment Command
TCI - Transmission Configuration Indication
TR - Technical Report
TRP - Transmission-Reception Point
T-RS - Tracking Reference Signal
Tx - Transmission
UE - User Equipment
UL - Uplink
WI - Working Item FIG. 2 is a diagram illustrating an example of a UE changing a serving beam when the UE moves spatially. 3GPP, Release 15 (Rel. 15) includes the concept of beam management (BM) to enable fast and efficient change of downlink (DL) (and uplink (UL)) beam to be used by a UE. For 3GPP Rel. 15 BM, it may be assumed that transmission points (e.g., access point (AP), RRH, TRP or TRxP), radio unit (RU), RRU or similar) for all the DL beams used in a serving cell are collocated. Under such an assumption, from the perspective of a UE, transmission of signals from a cell happens from the same point/origin in space. The UE uses this assumption to direct its receiving (Rx) beam settings correctly (and accordingly).

Referring to FIG. 2, in the example illustrated in FIG. 2, a first remote radio head RRH RRH1 uses first through third transmission (Tx) beams 212, 214 and 216 to transmit first through third RRH1 synchronization signal blocks (SSB)-1-1 to SSB-1-3, respectively. In the example illustrated in FIG. 2, first through third Tx beams 212, 214 and 216 are DL beams, and thus, may also be referred to as first through third DL beams 212, 214 and 216. FIG. 2 also illustrates a UE 206 at first and second spatial positions Pos. 1 and Pos. 2. As is illustrated in FIG. 2, UE 206 is capable of forming at least first, second and third reception (Rx) beams 222, 224 and 226 for receiving transmissions. According to at least some example embodiments, the first RRH RRH1 of FIG. 2 may be an example of one of TRPs 102A, 102B, 102C of FIG. 1A, and the UE 206 of FIG. 2 may be an example of UE 106 of FIG. 1A.

FIG. 2 illustrates an example scenario in which the UE 206 is moving from the first spatial position Pos. 1 to the second spatial position Pos. 2. In the example scenario illustrated in FIG. 2, a serving beam of the UE 206 is the first Tx beam 212 via which the first RRH RRH1 transmits the first RRH1 SSB SSB-1-1 while the UE 206 is located at first spatial position Pos. 1, and when the UE 206 moves from the first spatial position Pos. 1 to the second spatial position Pos. 2, the UE 206 changes its serving beam to the second Tx beam 216 via which the first RRH RRH1 transmits the third RRH1 SSB SSB-1-3. The above-referenced serving beam switching is enabled by UE 206 performing and reporting beam level measurements (e.g., Layer 1 Reference Signal Received Power (L1-RSRP)) to the network (e.g., reporting to CN 130 of FIG. 1A via gNB 102 of FIG. 1A) which then requests (e.g., with a transmission configuration indication (TCI) state switch command) the UE 206 to use an appropriate DL beam, i.e., SSB-1-3 in the example. In addition, the UE 206 may autonomously (i.e., based on its own internal and non-standardized algorithm) change from one DL spatial setting (e.g., Rx beam setting) to another and/or change a panel used for reception (e.g., by selecting a new panel from among panels 1062, 1064, 1066 and 1068 of FIG. 1A).

Figure 3:
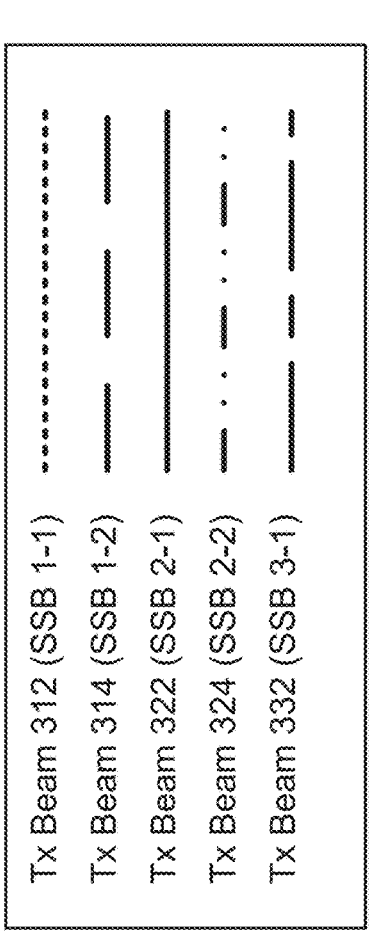
FIG. 3 is a diagram illustrating an example of a user equipment (UE) changing between serving beams when the UE moves spatially in an environment with multiple non-collocated transmission/reception points (TRPs).
Figure 3:
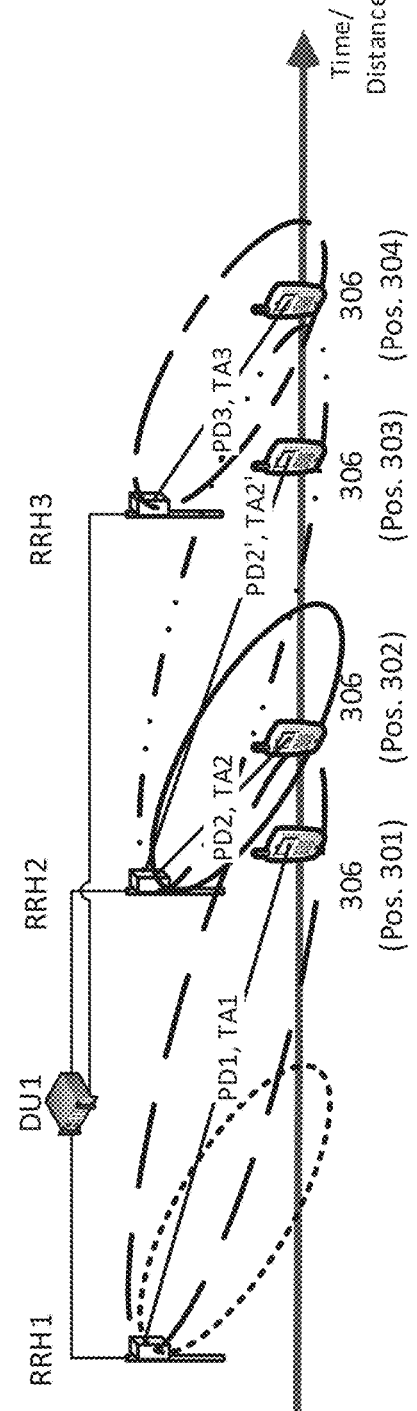

FIG. 3 is a diagram illustrating an example of a user equipment (UE) changing between serving beams when the UE moves spatially in an environment with multiple non-collocated transmission/reception points (TRPs).

In the example illustrated in FIG. 3, first, second and third RRHs RRH1, RRH2 and RRH3 are each connected to a first distributed unit (DU) DU1 Further, FIG. 3 illustrates an example scenario in which a UE, UE 306, moves from a first position 301 to second, third and fourth positions 302, 303 and 304, sequentially, over time. According to at least some example embodiments, the first, second and third RRHs RRH1-RRH3 are examples of TRPs of the gNB 102 of FIG. 1A (e.g., TRPs 102A, 102B, 102C), the UE 306 is an example of UE 106 of FIG. 1A, and first DU DU1 is a gNB-DU of the gNB 102 of FIG. 1A.

In the example illustrated in FIG. 3, the first RRH RRH1 uses first and second RRH1 Tx beams 312 and 314 to transmit first RRH1 SSB SSB 1-1 and second RRH1 SSB SSB 1-2, respectively; the second RRH RRH2 uses first and second RRH2 Tx beams 322 and 324 to transmit first RRH2 SSB SSB 2-1 and second RRH2 SSB SSB 2-2, respectively; and the third RRH RRH3 uses first RRH2 Tx beam 332 to transmitted first RRH3 SSB SSB 3-1.

In the example illustrated in FIG. 3, when the UE 306 is at first through fourth positions 301, 302, 303 and 304, the serving beams of the UE 306 are the Tx beams 314 of first RRH RRH1, 322 of second RRH RRH2, 324 of second RRH RRH2 and 332 of third RRH RRH3, respectively. As is illustrated in FIG. 3, when the UE 306 is in first position 301, the UE receives second RRH1 SSB SSB 1-2 with a propagation delay (PD) PD1, and thus, a the UE 306 uses a timing adjustment (TA) TA1 based on PD PD1; when the UE 306 is in second position 302, the UE receives first RRH2 SSB SSB 2-1 with a PD PD2, and thus, a the UE 306 uses a TA TA2 based on PD PD1; when the UE 306 is in third position 303, the UE receives second RRH2 SSB SSB 2-2 with a PD PD2', and thus, a the UE 306 uses a TA TA2' based on PD PD2'; and when the UE 306 is in fourth position 304, the UE receives first RRH3 SSB SSB 3-1 with a PD PD3, and thus, a the UE 306 uses a TA TA3 based on PD PD3. In FIG. 3, relative magnitudes of PDs and TAs are shown by the lengths of the lines illustrated in FIG. 3 as corresponding to the PDs and TAs. Thus, as is illustrated in FIG. 3, as a spatial distance between the UE 306 and the TRP providing the current serving beam of the UE 306 increases, a PD with which a DL transmission (e.g., an SSB) is received from the serving beam and a corresponding TA used by the UE both increase (e.g., PD2 and TA2 increase to PD2' and TA2' as UE 306 moves farther away from second RRH RRH2, as FIG. 3 illustrates).

The example environment illustrated in FIG. 3 is an example of a high mobility environment, e.g., a high speed train (HST) environment in which a UE located on a moving high speed train passes multiple TRPs. Further, in the example illustrated in FIG. 3, the UE 306 may operate in frequency range 2 (FR2). In a such scenario as HST in FR2, the collocation assumption, discussed above with respect to FIG. 2, made by a UE with respect to base station (BS)-side Tx beams is not valid anymore. As it is shown in FIG. 2, several RRHs can be connected to the same DU (i.e., first DU DU1). Further, synchronization blocks (SSBs) from different RRHs may share the same physical cell ID (PCI). Therefore, a legacy BM procedure, i.e., L1-based beam/TCI state switching, is used to provide mobility in between the RRHs.

One type of over the air (OTA) radio resource management (RRM) test involves testing the generation of UL TAs in an environment where a UE experiences reception from multiple non-collocated sources (e.g., RRHs) in HST FR2 deployment. As is shown by the example illustrated in FIG. 3, PDs PD1 and PD2 can be very different in the area where the UE needs to switch from SSB beam 1-2 to the SSB beam 2-1. Thus, the TA of the UL Tx (i.e., UL timing) shall be also adjusted to accommodate the jump in propagation delays of 2×(PD2–PD1). Due to a need to synchronize to a new beam with very different timing, the beam switch delay at UE can be also longer than for the beams with the same origin. This is one reason why the collocation assumption with respect to multiple TRPs may not be valid for a scenario like that illustrated in FIG. 3. Thus, as is discussed in greater detail below with respect to FIG. 4, testing environments that are designed to test scenarios for which the above-referenced collocation assumption is valid may not be suitable for testing scenarios for which the above-referenced collocation assumption is not valid.

Figure 4:
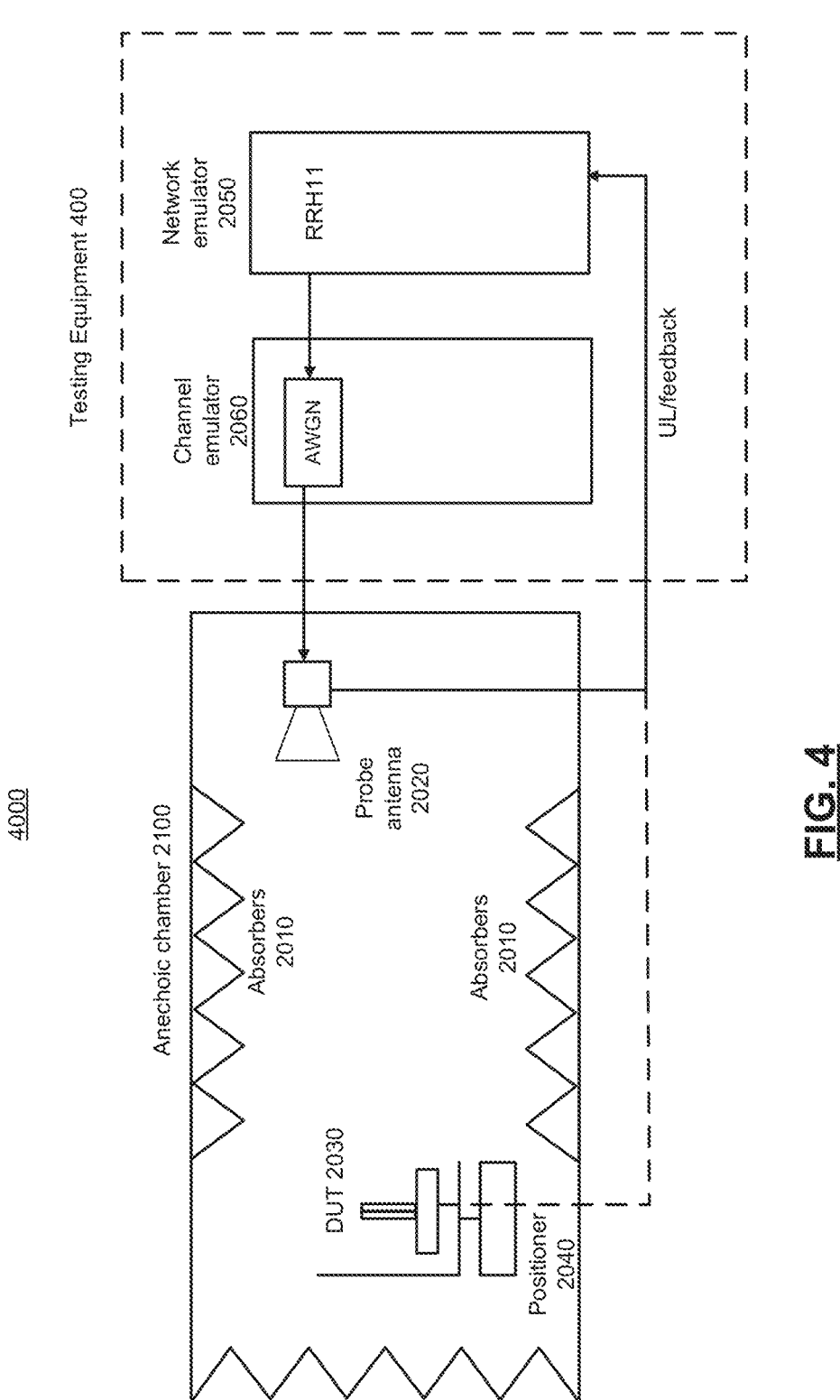
FIG. 4 illustrates an example radio resource management (RRM) testing environment for performing over the air (OTA) testing on a device under test (DUT).

FIG. 4 illustrates an example testing environment for performing over the air (OTA) testing on a device under test (DUT). Multiple performance guidelines and requirements and corresponding test procedures for performing OTA testing with respect to the aforementioned performance guidelines and requirements are discussed in 3GPP technical specification (TS) 38.133 (Ver. 17.6.0), the entire contents of which are incorporated herein by reference. As is illustrated in FIG. 4, the testing environment includes a testing system 4000, which may include a testing chamber 2100 and testing equipment 400. The testing chamber 2100 may be, for example, an anechoic chamber. The testing chamber 2100 may include absorbers 2010, for example, on one or more inner walls of the testing chamber 2100. Further, within the testing chamber 2100, a first probe antenna 2020 may be configured to transmit radio frequency (RF) signals to a device under test (DUT) 2030 for the purpose of testing the DUT 2030. According to at least some example embodiments, the DUT may be a user equipment (UE). Further, the DUT 2030 may be located on a positioner 2040 which may facilitate selectively positioning the DUT 2030 at a desired location within the testing chamber 2100.

The testing equipment 400 may include a network emulator 2050 and a channel emulator 2060. The network emulator 2050 is configured to emulate signals of a network element such as, for example, a TRP (e.g., an RRH or RRU). In the example illustrated in FIG. 4, the network emulator 2050 emulates signals of a virtual remote radio head (RRH), first virtual RRH RRH11. The channel emulator 2060 is configured to emulate a channel through which a signal may be transmitted. In the example illustrated in FIG. 4, the channel emulator 2060 includes an additive white Gaussian noise (AWGN) unit configured to generate an emulated signal by applying AWGN to the emulated signal of the first virtual RRH RRH11 generated by the network emulator 2050. As is illustrated in FIG. 4, the emulated signal generated by the channel emulator 2060 (i.e., the emulated signal of the first virtual RRH RRH11 to which AWGN has been applied) is provided to the first probe antenna 2020, which transmits the emulated signal within the testing chamber 2100 thereby performing OTA testing by subjecting the DUT 2030 to a simulation of an environment in which a RRH corresponding to the first virtual RRH RRH11 is transmitting signals to the UE.

There are limitations with respect to the types of scenarios that can be simulated for OTA testing using the testing environment illustrated in FIG. 4. For example, due to the presence of only a single first probe antenna 2020 configured to transmit emulated signals corresponding to a single TRP (i.e., first virtual RRH RRH11), the testing environment illustrated in FIG. 4 is generally not suitable for simulating scenarios in which the DUT 2030 receives signals from multiple, non-collocated TRPs. As another example of the aforementioned limitations of the testing environment illustrated in FIG. 4, due to the limited space in the testing chamber and the substantially stationary position of both the DUT 2030 and the first probe antenna 2020 during testing, the testing environment illustrated in FIG. 4 is generally not suitable simulating high mobility scenarios. A high mobility scenario may be any scenario in which a UE travels at a relatively high speed relative to one or more TRPs. Examples of high mobility scenarios include, but are not limited to, a scenario where a UE is on a high speed train (HST), a scenario in which a UE is in a vehicle such as a car traveling on a highway, a scenario in which a UE is carried by or incorporated into a flying drone, and/or a scenario in which a UE is carried by or incorporated into an orbiting satellite. As yet another example of the aforementioned limitations of the testing environment illustrated in FIG. 4, a probe antennas (e.g., first probe antenna 2020) used to transmit the signal to the UE in the chamber may have its own beam characteristics that are not impacted by, or rather do not follow, the 5G NR beam based interface (or the radio unit implementation of a device being simulated by the test environment).

Accordingly, it would be beneficial to develop a way to address the above-referenced OTA testing limitations of the testing environment of FIG. 4. For example, it would be beneficial to develop a way to facilitate the simulation of scenarios that include multiple non-collocated TRPs and/or high mobility of the UE using the existing equipment of testing environments such as the testing environment of FIG. 4, e.g., without the need to alter the size of the testing chamber, include additional probe antennas, and/or change the substantially stationary nature of the DUT and single probe antenna.

Example methods and testing equipment for performing over the air OTA testing on DUTs with respect to non-collocated multiple TRP and/or high mobility UE scenarios according to at least some example embodiments will now be discussed below with reference to FIGS. 5A-10C. One example goal of the example methods and testing equipment according to at least some example embodiments is to facilitate testing or RRM and/or demodulation requirements that involve UE mobility/dynamic geometry and transmission of radio signals from several non-collocated sources (e.g., TRPs, APs, RRHs, Radio Units (RU), panels, etc.) in an OTA testing setup that includes testing dynamic beams, for example, with a fixed single signal active probe antenna.

As it will be discussed in greater detail below, testing equipment according to at least some example embodiments includes signal emulation circuitry for generating changing "effective" beampatterns. The changing effective beampatterns simulate, e.g., for use in a test environment with a limited number of fixed single signal active probe antennas, beampatterns of one or more TRPs by having characteristics (e.g., signal power, signal phase, and/or signal delay) that vary over time. Thus, testing equipment according to at least some example embodiments may be used to adapt an existing test environment that is suitable for performing OTA with respect to static beampatterns, like the testing environment illustrated in FIG. 4, for performing OTA testing with respect dynamic beampatterns, such as the DL beampatterns that change over time from the perspective of a moving UE.

Figure 5A:
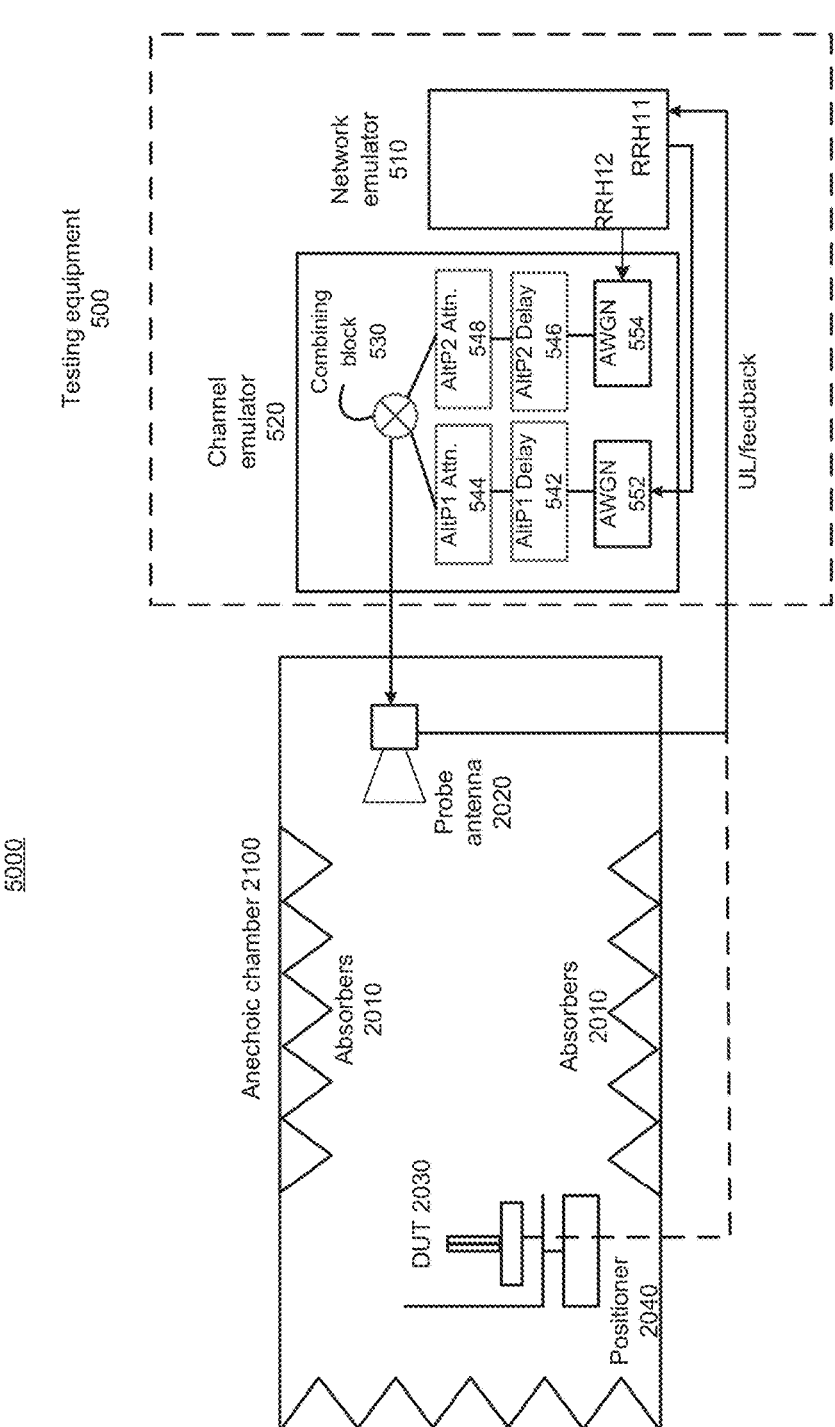
FIG. 5A illustrates an example RRM testing environment for performing over the air OTA testing on a device under test (DUT) with respect to non-collocated multiple TRP and/or high mobility UE scenarios according to at least some example embodiments.

FIG. 5A illustrates an example RRM testing environment for performing over the air OTA testing on a DUT with respect to non-collocated multiple TRP and/or high mobility UE scenarios according to at least some example embodiments.

As is illustrated in FIG. 5A, the testing environment of FIG. 5A may include a testing system 5000 which may include the same testing chamber 2100 of the testing system 4000 of FIG. 4, and the testing chamber 2100 in FIG. 5A may include the same elements illustrated in FIG. 4. Accordingly, repeated descriptions are omitted. According to at least some example embodiments, the testing system 5000 of FIG. 5A differs from the testing system 4000 of FIG. 4 in that the testing system 5000 includes testing equipment 500 instead of testing equipment 400. Testing equipment 500 includes a network emulator 510 and a channel emulator 520. The network emulator 510 is configured to emulate signals of a number of network elements such as, for example, TRPs (e.g., an RRH or RRU). In the example illustrated in FIG. 4, the network emulator 510 emulates signals of two virtual RRHs, first virtual RRH RRH11 and second virtual RRH RRH12, (which are also referred to in the present specification as a first initial emulated DL signal and a second initial emulated DL signal, respectively), and provides the emulated signals of the two virtual RRHs to the channel emulator 520. For ease of description, network emulator 510 is illustrated as emulating DL signals of two virtual TRPs, first and second virtual RRHs RRH11 and RRH12. However, network emulator 510 may emulate the DL signals of any number of virtual TRPs, for example, in accordance with the preferences of an entity using the test environment of FIG. 5A.

The channel emulator 520 is configured to emulate a channel or channels through which signals may be transmitted. According to at least some example embodiments, for each of multiple virtual TRPs (e.g., RRH11 and RRH12), the channel emulator 520 is capable of generating an emulated signal by emulating a channel with respect to signals of each of the multiple virtual TRPs. According to at least some example embodiments, the channel emulator 520 is capable of generating each of the emulated signals in accordance with a different signal alternation profile by applying, to initial emulated DL signals received from the network emulator 510, corresponding signal alternation profiles. According to at least some example embodiments, a signal alternation profile includes one or more alternation characteristics that vary overtime. Further, the one or more alternation characteristics may vary over time, for example, in accordance with simulated movement of the DUT 2030 (e.g., a UE) relative to a virtual location of the virtual TRP for which the channel emulator 520 is emulating a channel. The one or more alternation characteristics that vary over time included in a signal alternation profile may also be referred to, in the present specification, as dynamic alternation characteristics of a signal alternation profile. Examples of the one or more dynamic alternation characteristics that may be included in a signal alternation profile include, but are not limited to, signal power attenuation, signal delay, signal frequency offset, or signal phase. In the example illustrated in FIG. 5A, the channel emulator 520 emulates a channel for signals of the first virtual RRH RRH11 in accordance with a first signal alternation profile AltP1, and emulates a channel for signals of the second virtual RRH RRH12 in accordance with a second signal alternation profile AltP2. For example, the channel emulator 520 may include a combining block 530, a first signal alternation profile AltP1 delay unit 542 for applying a changing signal delay to emulated signals of the first virtual RRH RRH11, a first signal alternation profile AltP1 attenuation unit 544 for applying a changing signal power attenuation to emulated signals of the first virtual RRH RRH11, a second signal alternation profile AltP2 delay unit 546 for applying a changing signal delay to emulated signals of the second virtual RRH RRH12, and a second signal alternation profile AltP2 attenuation unit 548 for applying a changing signal power attenuation to emulated signals of the second virtual RRH RRH12. As is illustrated in FIG. 5A, the channel emulator 520 may also include first and second AWGN units 552 and 554 for applying AWGN to emulated signals of the first virtual RRH RRH11 and emulated signals of the second virtual RRH RRH12, respectively. According to at least some example embodiments, the testing equipment 500 may have the structure of the system element 200 illustrated in FIG. 1B. Further, according to at least some example embodiments, the network emulator 510 and/or the channel emulator 520, and/or elements thereof (e.g., the combining block 530, first signal alternation profile AltP1 delay unit 542, first signal alternation profile AltP1 attenuation unit 544, second signal alternation profile AltP2 delay unit, second signal alternation profile AltP2 attenuation unit 548, first AWGN unit 552 and/or second AWGN unit 554), are embodied by the testing equipment 500 (e.g., as software/firmware executed by processors of the testing equipment 500 and/or circuitry included in the testing equipment 500). Thus, according to at least some example embodiments, operations described in the present specification as being performed by (or with respect to) the network emulator 510 and/or the channel emulator 520, or an element thereof, may be performed by (or with respect to) the testing equipment 500. Further, in the example illustrated in FIG. 5A, AWGN channels are primarily referenced as examples of channels emulated by the channel emulator 520. However, according to at least some example embodiments, the channels emulated by the channel emulator 520 are multi-tap fading channels (e.g., tapped delay line (TDL)) or channels with Doppler shift profiles.

An example method of operating the testing equipment 500 to perform OTA testing of dynamic beam adaptive RRM and demodulation requirements will now be discussed in greater detail below.

FIG. 5B is a flowchart illustrating a method for performing over the air (OTA) testing of a UE in a testing chamber that includes at least one probe antenna, using signal alternation profiles. FIG. 5B will be explained with reference to the testing equipment 500 of the testing system 5000 of FIG. 5A.

Referring to FIG. 5B, in step S512, a first emulated downlink (DL) signal of a first virtual transmission/reception point (TRP) is generated in accordance with a first signal alternation profile. For example, the testing equipment 500 (e.g., the network emulator 510) may generate an initial emulated DL signal of first virtual RRH RRH11 and the testing equipment 500 (e.g., the channel emulator 520) may generate a first signal alternation profile AltP1 emulated signal by using the first signal alternation profile AltP1 delay unit 542, the first signal alternation profile AltP1 attenuation unit 544, and a first signal alternation profile AltP1 frequency offset unit (not illustrated) to apply dynamic delay, power attenuation, and frequency offset values, respectively, to an initial emulated DL signal of the first virtual RRH RRH11. According to at least some example embodiments, the dynamic alternation characteristics of the first signal alternation profile AltP1 are calculated in order to simulate, within the testing environment of FIG. 5A (e.g., using testing system 5000), the manner in which DL signals received at the DUT 2030 from the first virtual RRH RRH11 would change over time in a particular scenario being tested by the testing system 5000 of FIG. 5A, such as, a high mobility scenario in which the DUT 2030 is moving relative to a virtual position of the virtual TRP (i.e., the first virtual RRH RRH11).

According to at least some example embodiments, the dynamic alternation characteristics of the first signal alternation profile AltP1 are calculated off-line and then loaded into the channel emulator 520 to be applied, by the channel emulator 520, to the emulated signals of first virtual RRH RRH11 (e.g., by using the first signal alternation profile AltP1 delay unit 542, the first signal alternation profile AltP1 attenuation unit 544, and a first signal alternation profile AltP1 frequency offset unit (not illustrated)). Alternatively, according to at least some example embodiments, the dynamic alternation characteristics of the first signal alternation profile AltP1 are both calculated and applied by the channel emulator 520 (e.g., by using the first signal alternation profile AltP1 delay unit 542, the first signal alternation profile AltP1 attenuation unit 544, and a first signal alternation profile AltP1 frequency offset unit (not illustrated)). Examples of ways in which dynamic alternation characteristics of a signal alternation profile are calculated will now be discussed in greater detail below with reference to FIGS. 6A and 6B.

Figure 6A:
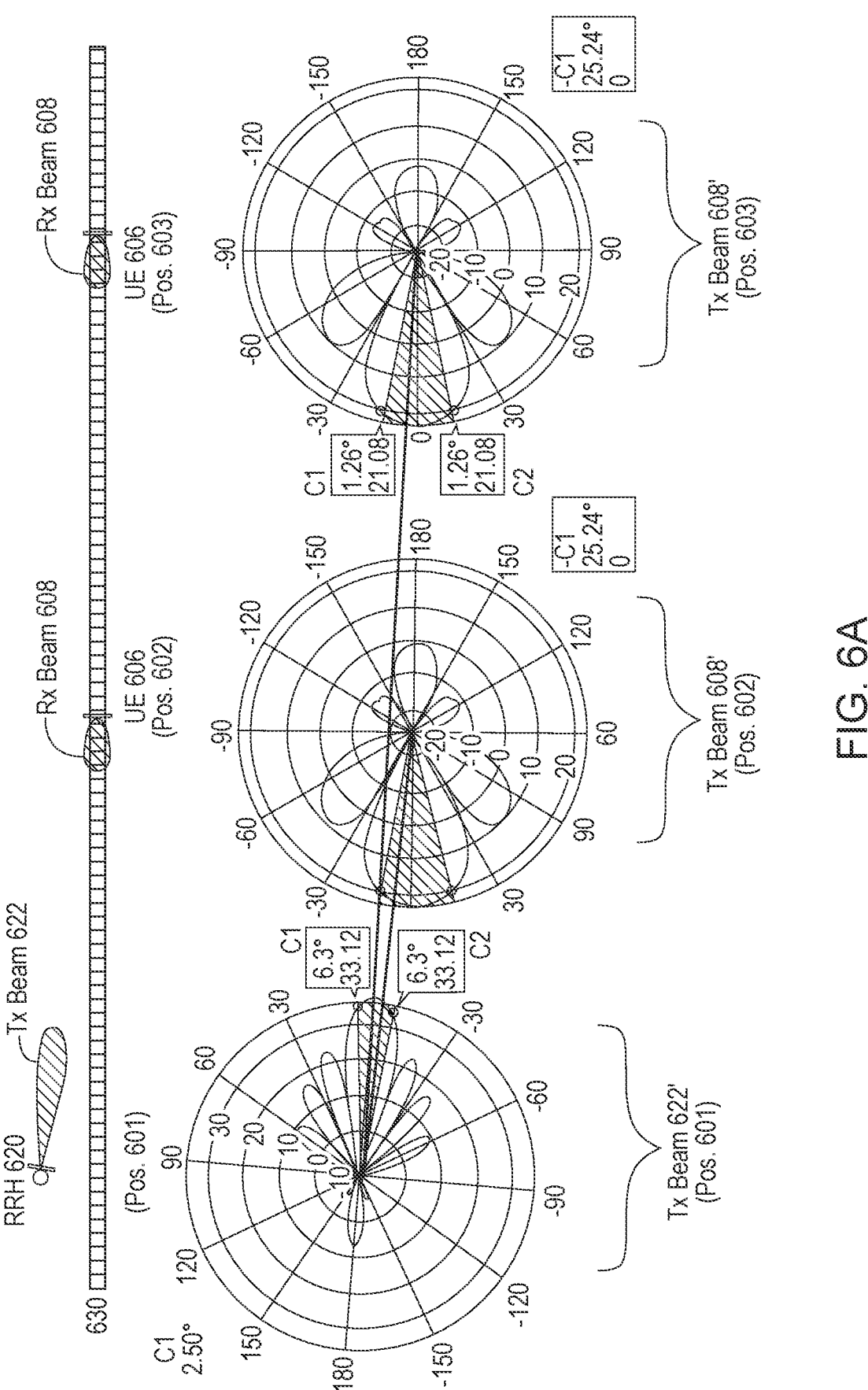
FIG. 6A is a diagram for explaining a change in transmission (Tx) and reception (Rx) beamforming gains due to UE mobility.

FIG. 6A is a diagram for explaining a change in transmission (Tx) and reception (Rx) beamforming gains due to UE mobility. FIG. 6A illustrates a UE 606 in a high mobility scenario. The high mobility scenario illustrated in FIG. 6A is, for example, uni-directional HST scenario where a UE 606 is moving from left to right along a path 630 with respect to a static position of a first RRH 620. For example, in the example illustrated in FIG. 6A, the first RRH 620 is located at first position 601, and the UE 606 is illustrated at a second position 602 at a first point in time and a third position 603 at a second, later, point in time. As is illustrated in FIG. 6A, the first RRH 620 has a Tx beam 622 and the UE 606 has an Rx beam 608. Further, FIG. 6A illustrates Tx beampattern 622' corresponding to Tx beam 622 and Rx beampatterns 608' at the second position 602 and the third position 603 corresponding to Rx beam 608. FIG. 6A also includes lines illustrating spatial relationships between Tx beampattern 622' of the first RRH 620 and Rx beampattern 608' at each of second and third positions 602 and 603. As is also illustrated in FIG. 6A, an angle of arrival (AoA) and angle of departure (AoD) may change over time as the UE 606 moves with respect to the first position 601 of the first RRH 620. Accordingly, FIG. 6A provides an example of how beamforming gain may change when UE 606 is moving away from the first RRH 620 from second position 602 to third position 603 in a uni-directional HST scenario. In a general case, the antenna gains will depend on the angle of departure (AoD) from the RRH and the AoA to the UE. Accordingly, there is an issue with respect to how to simulate a high mobility UE scenario with a dynamic, changing AoA in a test environment where orientations and/or physical locations of a DUT (e.g., a UE) and/or a single probe antenna are fixed. An example manner of addressing this issue will now be discussed in greater detail below.

For example, according to at least some example embodiments, if the mobility of a UE is known, time and beam pattern dependent signal-to-noise ratio (SNR) and/or reference signal received power (RSRP) values can be pre-calculated, e.g., as a time trace of the SNR and or RSRP, and controlled with an attenuator dynamically even if AoA/AOD are fixed in the test setup. The term pre-calculated, as used in the present specification with respect to a channel characteristic or time trace associated with a moving UE, refers to calculation that occurs before or without actual movement of the UE.

As one example, the SNR can be defined in accordance with Equation (1), below.

$$SNR[dB]=Tx\_power+RRH\_antenna\_gain+UE\_antenna\_gain-Path\ loss-Noise \qquad (1)$$

According to another example, a propagation delay may depend, for example, only on the distance in between an RRH and UE. Therefore, a time trace of propagation delay and/or phase shift matching the time trace of the SNR and UE mobility can be created (e.g., pre-calculated). Further, a time trace of a frequency offset may be derived from the time trace of the phase shift in accordance with known methods.

Thus, according to at least some example embodiments, both attenuation values (e.g., SNR and/or RSRP values) and delay values may be derived algorithmically by simulating/calculating the beam patterns of RRH products according to an RRH/network/hardware configuration being simulated by a particular test operation of a test environment. Further, the virtual position of a DUT with respect to beam patterns during a test operation may be used to geometrically derive the currently applicable parts of the beam patterns. According to at least some example embodiments, dynamic changes (e.g., sweeping, changing radiation profiles, environmental reflections/wave impacts, etc.) of the RRHs' operations may also be included in the simulation of the beam patterns.

Figure 6B:
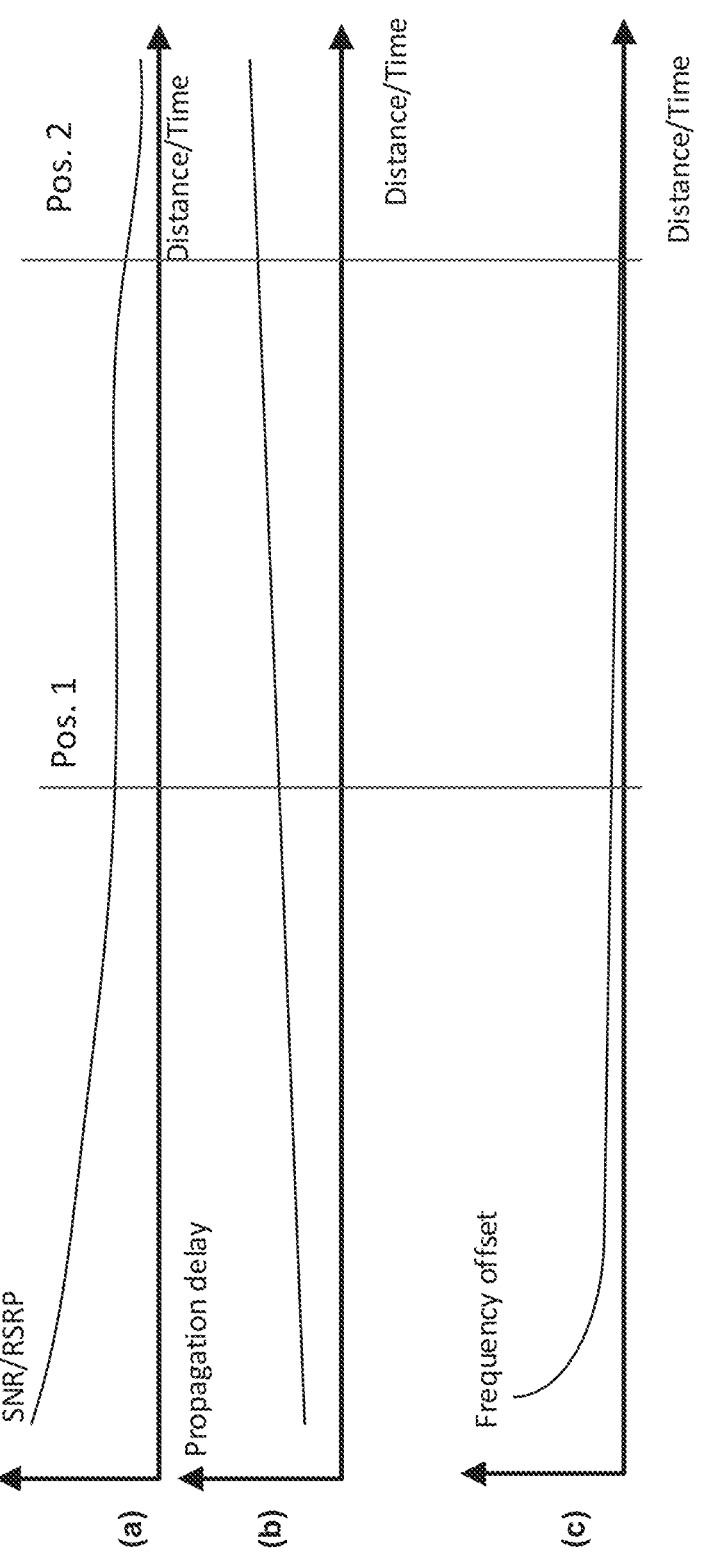
FIG. 6B is a diagram for explaining changes in alternation characteristics due to UE mobility.

FIG. 6B is a diagram for explaining changes in alternation characteristics due to UE mobility. Referring to FIG. 6B, items (a), (b) and (c) are graphs illustrating time traces of alternation characteristics (i.e., changes in alternation characteristics over time as the UE 606 moves along the path 630 relative to the first position 601 of the first RRH 620). The changing alternation characteristics for which time traces are illustrated in items (a), (b) and (c) of FIG. 6B are a signal to noise ratio (SNR), a propagation delay, and a frequency offset, respectively.

According to at least some example embodiments, the channel emulator 520 is capable of generating first signal alternation profile AltP1 emulated signals by using the alternation profile units (e.g., the AltP1 delay unit 542, AltP1 attenuation unit 544, and AltP1 frequency offset unit (not illustrated)) to apply dynamic channel characteristic values to the emulated signal of the first virtual RRH RRH11 based on time traces, like those illustrated in FIG. 6B, calculated for each of the dynamic alternation characteristics of the first signal alternation profile AltP1. For example, with respect to the example illustrated in FIG. 5A, the AltP1 delay unit 542 may apply delay values from (or based on) a pre-calculated delay time trace like item (a) of FIG. 6B, the AltP1 attenuation unit 544 may apply power attenuation values from (or based on) a pre-calculated SNR time trace like item (b) of FIG. 6B, and the AltP1 frequency offset unit (not illustrated) may apply frequency offset values from (or based on) a pre-calculated frequency offset time trace like item (c) of FIG. 6B.

Returning to FIG. 5B, after step S512, the testing equipment 500 may proceed to step S514. In step S514, a second emulated DL signal of a second virtual TRP is generated in accordance with a second signal alternation profile. For example, the testing equipment 500 (e.g., the network emulator 510) may generate an initial emulated DL signal of second virtual RRH RRH12 and the testing equipment 500 (e.g., the channel emulator 520) may generate a second signal alternation profile AltP2 emulated signal by using the second signal alternation profile AltP2 delay unit 546, the second signal alternation profile AltP2 attenuation unit 548, and a second signal alternation profile AltP2 frequency offset unit (not illustrated) to apply dynamic delay, power attenuation, and frequency offset values, respectively, to the initialed emulated DL signal of the second virtual RRH RRH12. According to at least some example embodiments, the dynamic alternation characteristics of the second signal alternation profile AltP2 are calculated in order to simulate, within the testing environment of FIG. 5A (e.g., using testing system 5000), the manner in which DL signals received at the DUT 2030 from the second virtual RRH RRH12 would change over time in a particular scenario being tested by the testing system 5000 of FIG. 5A, such as, a high mobility scenario in which the DUT 2030 is moving relative to a virtual position of the virtual TRP. The dynamic alternation characteristics of the second signal alternation profile AltP2 may be calculated in the same or substantially the same manner discussed above with respect to the first signal alternation profile AltP1 with reference to FIGS. 5B, 6A and 6B.

Figure 6C:
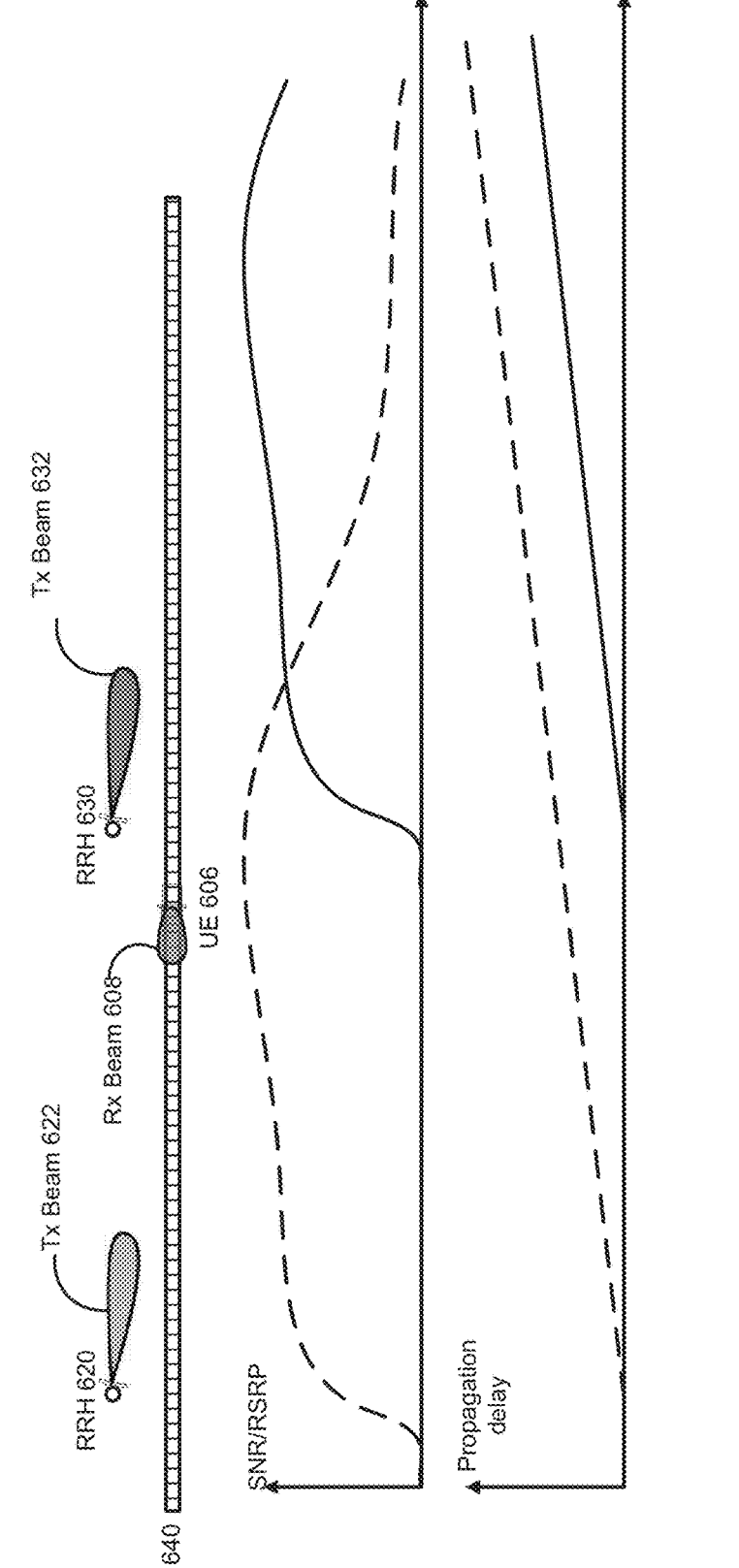
FIGS. 6C and 6D are diagrams for explaining changes in alternation characteristics in a multi-TRP scenario due to UE mobility.
Figure 6D:
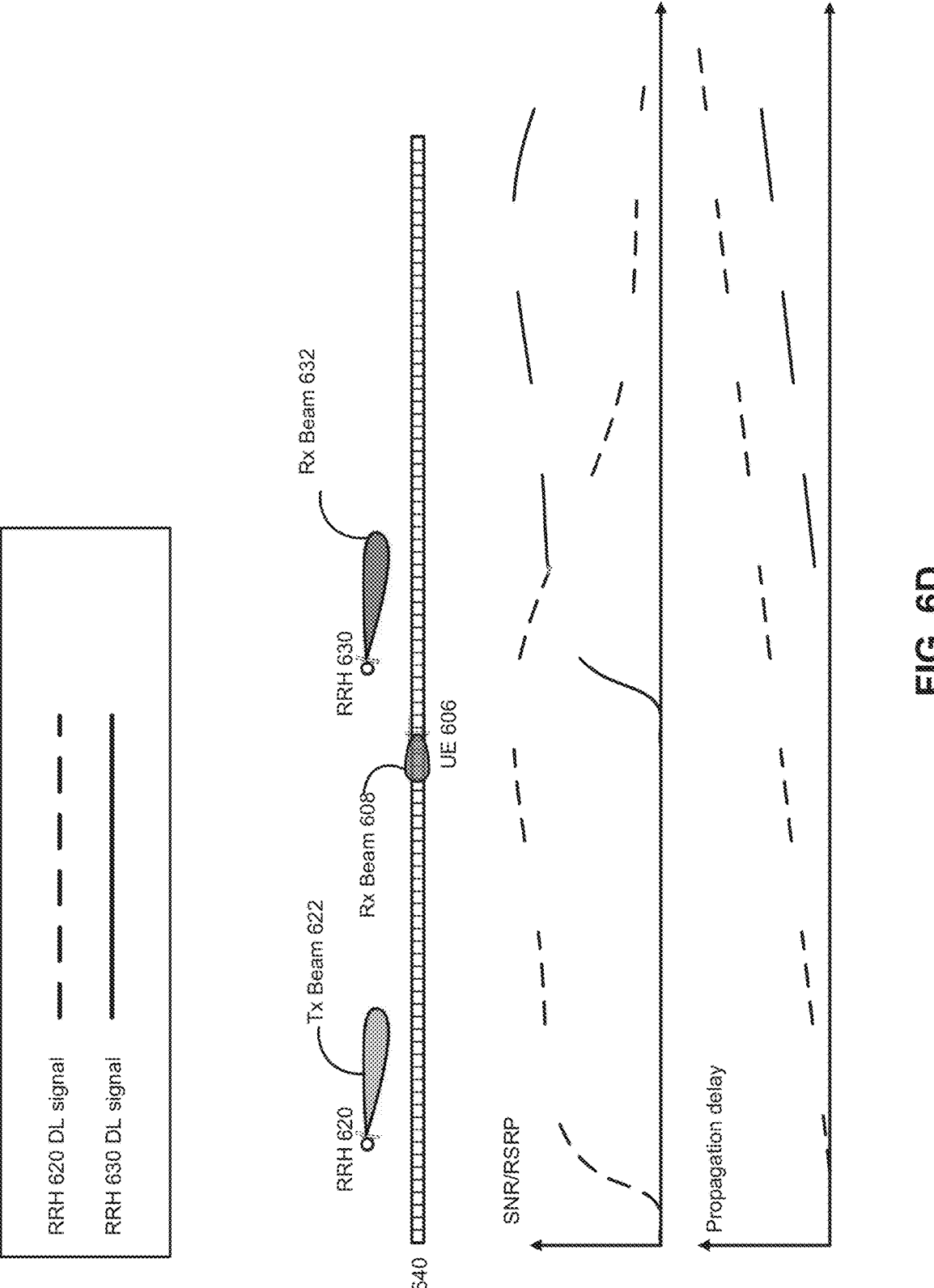

After step S514, the testing equipment 500 may proceed to step S516. In step S516, the testing equipment 500 provides the first and second emulated DL signals to at least one probe antenna and transmits signals for testing the UE based on the first and second emulated DL signals. Step S516 will be described with reference to FIGS. 5A, 6C and 6D. FIGS. 6C and 6D are diagrams for explaining changes in alternation characteristics in a multi-TRP scenario due to UE mobility.

As is discussed in greater detail below, according to at least some example embodiments, in the example illustrated in FIG. 5A, the combining block 530 of the channel emulator 520 includes radio frequency (RF) summation circuitry and/or time domain multiplexing circuitry for combining two different emulated DL signals associated with two different virtual TRPs (and two different alternation profiles) so as to generate a single combined emulated signal that can be transmitted by a single fixed probe antenna so as to simulate, from the perspective of a DUT, two different received DL signals. For example, FIG. 6C illustrates an example of dynamic alternation characteristics associated with the first and second RRHs 620 and 630. Similar to FIG. 6A, FIG. 6C illustrates the first RRH 620 having the first Tx beam 622, as well as the UE 606 moving from left to right along a path 630 in a high mobility scenario, such as an HST scenario. Accordingly, repeated descriptions are omitted. Relative to FIG. 6A, FIG. 6C additionally includes a second RRH 630 having a second Tx beam 632. FIG. 6C also illustrates SNR/RSRP and propagation delay alternation characteristics over time with respect to a first RRH 620 DL signal and a second RRH 630 DL signal. As is illustrated in FIG. 6C, the alternation characteristics associated with the first RRH 620 DL signal and the alternation characteristics associated with the second RRH 630 DL signal may vary in different ways over time as the UE 606 moves. Example methods by which a single combined DL signal capturing the dynamic alternation characteristics of two different DL signals is generated will now be discussed below.

Returning to FIG. 5B, in step S516 the combining block 530 may receive the first signal alternation profile AltP1 emulated signal (which is an example of a first emulated DL signal) from the first signal alternation profile AltP1 attenuation unit 544, receive the second signal alternation profile AltP2 emulated signal (which is an example of a second emulated DL signal) from the second signal alternation profile AltP2 attenuation unit 548, combine the two received emulated DL signals by using RF summation circuitry to perform a summation operation on the two received emulated DL signals (e.g., adding the two received emulated DL signals together), and provide the combined emulated DL signal (i.e., the signal resulting from the summation of the received first and second emulated DL signals) to the first probe antenna 2020. Further, the first probe antenna 2020 transmits the combined emulated DL signal to the DUT 2030 in the testing chamber 2100.

Alternatively, according to at least some example embodiments, in addition to, or instead of, including RF summation circuitry and performing a summation operation, the combining block 530 includes multiplexing circuitry (e.g., one or more switch circuits) which it uses, in step S516, to combine the received first and second emulated DL signals by performing time domain multiplexing on the received first and second emulated DL signals thereby generating a time domain multiplexed emulated DL signal. Further, the combining block 530 may provide the combined emulated DL signal (i.e., the signal resulting from the performance of time domain multiplexing on the received first and second emulated DL signals) to the first probe antenna 2020. Further, the first probe antenna 2020 transmits the combined emulated DL signal to the DUT 2030 in the testing chamber 2100. For example, FIG. 6D illustrates an example of dynamic alternation characteristics of time domain multiplexed DL signals of the first and second RRHs 620 and 630 as the UE 606 moves along path 640. In a manner similar to that illustrated in FIG. 6C, when the combining block 530 generates combined emulated DL signal by performing time domain multiplexing, the combining block 530 may alternate between (i) outputting, as the combined emulated DL signal, the first emulated DL signal generated in accordance with the dynamic alternation characteristics of the first signal alternation profile AltP1, and (ii) outputting, as the combined emulated DL signal, the second emulated DL signal generated in accordance with the dynamic alternation characteristics of the second signal alternation profile AltP2.

Thus, according to at least some example embodiments, the testing equipment 500 is capable of generating a single combined emulated DL signal, based on first and second emulated DL signals (e.g., by performing summation or time domain multiplexing on the first and second emulated DL signals), in such a manner that the combined emulated DL signal can be transmitted by the single fixed first probe antenna 2020 in the testing chamber 2100 such that the DUT 2030 (e.g., a UE) experiences receiving a combination of two different DL signals associated with two different virtual RRHs as if the two different DL signals were transmitted from two different, non-collocated TRPs in a high mobility UE scenario.

Referring to FIGS. 5A and 5B, according to at least some example embodiments, the DL signals emulated by the network emulator 510 and provided to the channel emulator 520 are signals including SSBs (e.g., SSBs of the first virtual RRH RRH11 and second virtual RRH RRH12, respectively.) Thus, according to at least some example embodiments, the first emulated DL signal to which the first alternation profile AltP1 has been applied by the channel emulator 520 in step S512 (i.e., the first signal alternation profile AltP1 emulated signal) includes an SSB of the first virtual RRH RRH11, and the second emulated DL signal to which the second alternation profile AltP2 has been applied by the channel emulator 520 in step S514 (i.e., the second signal alternation profile AltP2 emulated signal) includes an SSB of the second virtual RRH RRH2. Thus, the combined emulated DL signal that is generated by the combining block 530 and provided to the first probe antenna 2020 in step S516 includes SSBs of the first and second virtual RRHs RRH11 and RRH12 so as to facilitate the testing of a scenario in which the DUT 2030 (e.g., a UE) uses SSBs to perform a process of determining whether to perform a handover (HO) operation (e.g., a process of switching a serving beam), perform a process of determining whether to change from one DL spatial setting (e.g., Rx beam setting) to another, and/or perform a process of determining whether to change a panel used for reception, as is discussed above with respect to FIG. 2. However, the signals that may be generated by the network emulator 510, and the signals to which alternation profiles may be applied by the channel emulator 520 are not limited to signals including SSBs, and may also be other signals including, but not limited to, signals including other elements (e.g., channel state information reference signal (CSI-RS), T-RS. Etc.) and/or signals for carrying particular channels (e.g., PDCCH, PDSCH, etc.).

For ease of description, FIGS. 5A and 5B are discussed above with respect to an example in which different signal alternation profiles AltPs are applied to different emulated DL signals of different virtual TRPs. However, as is discussed in greater detail below with respect to FIGS. 7A and 7B, according to at least some example embodiments, different path alternation profiles P_AltPs can be applied to different paths of a single signal (e.g., different paths through a channel by which the same transmitted DL signal is received by a UE).

Figure 7A:
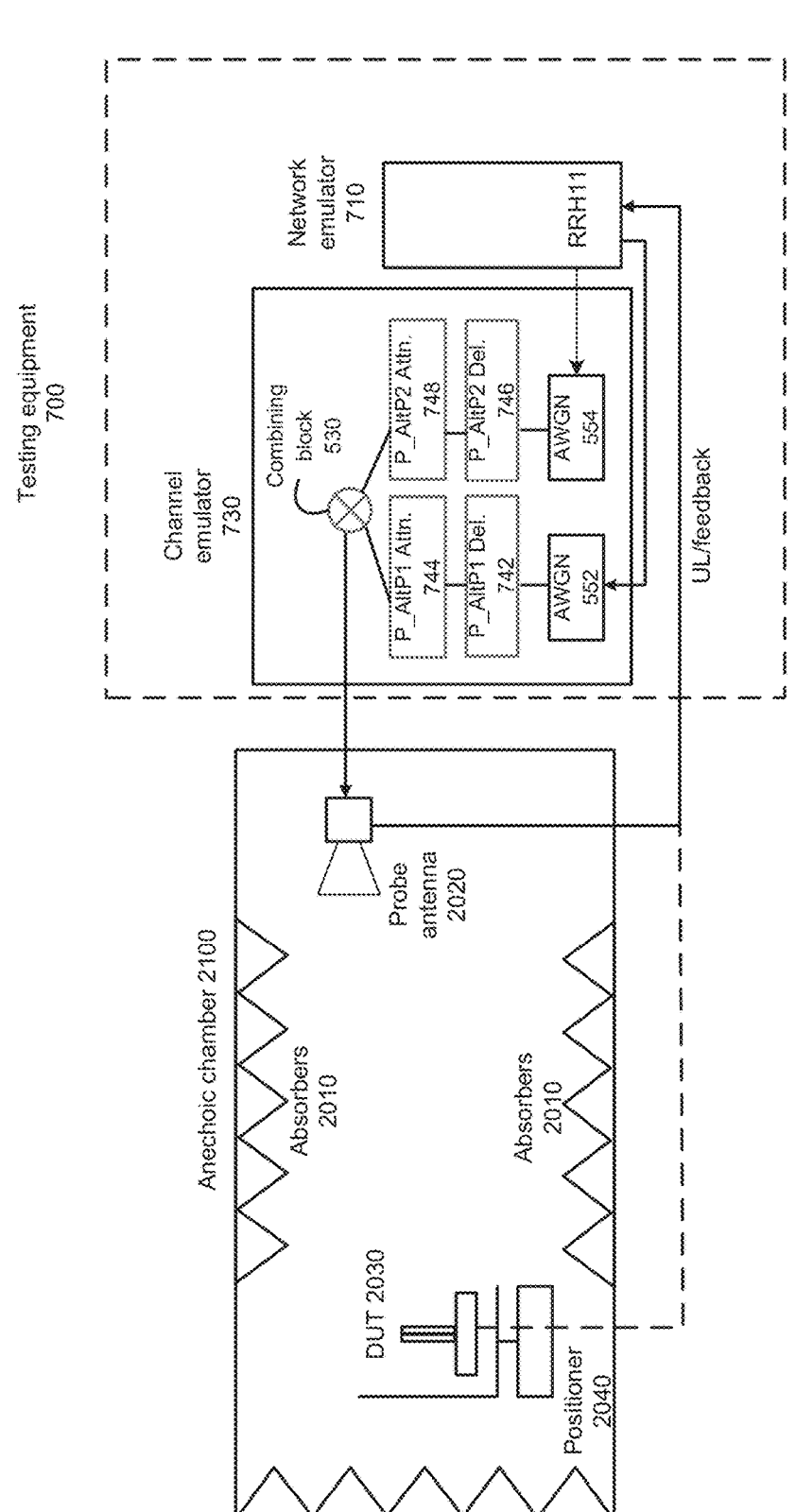
FIG. 7A illustrates an example for explaining path alternation profiles used in RRM testing environment for performing over the air OTA testing on a device under test (DUT) with respect to non-collocated multiple TRP and/or high mobility UE scenarios according to at least some example embodiments.

FIG. 7A illustrates an example for explaining path alternation profiles used in RRM testing environment for performing over the air OTA testing on a device under test (DUT) with respect to non-collocated multiple TRP and/or high mobility UE scenarios according to at least some example embodiments.

The testing environment of FIG. 7A includes a testing system 7000 which may include the same testing chamber 2100 and the same elements inside the testing chamber 2100 discussed above with respect to the testing system 5000 of FIG. 5A. Accordingly, repeated descriptions are omitted. The testing system 7000 of FIG. 7A also includes testing equipment 700. Testing equipment 700 includes a network emulator 710 and a channel emulator 730. For ease of description, network emulator 710 is illustrated as emulating a DL signal of a single virtual TRP, first virtual RRH RRH11. However, network emulator 710 may emulate the DL signals of any number of virtual TRPs, for example, in accordance with the preferences of an entity using the test environment of FIG. 7A.

The channel emulator 730 operates in a manner similar to that described above with respect to the channel emulator 520 of FIG. 5A. The channel emulator 730 differs from the channel emulator 500 in that, for a single DL signal of a virtual TRP emulated by the network emulator 710 (which is also referred to in the present specification as an initial emulated DL signal), the channel emulator 730 generates multiple emulated signals corresponding to different paths through which the same initial emulated DL signal is received by the DUT 2030 (e.g., a UE).

For example, the channel emulator 730 is configured to emulate a channel or channels through which signals may be transmitted. According to at least some example embodiments, for one or more virtual TRPs (e.g., RRH11), the channel emulator 730 is capable of generating an emulated signal by emulating different paths through a channel by a which a DL signal of a virtual TRP may travel to a DUT in a testing environment. According to at least some example embodiments, the channel emulator 730 is capable of generating each of the emulated signals in accordance with a different path alternation profile. According to at least some example embodiments, a path alternation profile includes one or more alternation characteristics that vary overtime. Further, the one or more alternation characteristics may vary over time, for example, in accordance with simulated movement of the DUT 2030 (e.g., a UE) relative to a virtual location of the virtual TRP for which the channel emulator 730 is emulating a path through a channel. The one or more alternation characteristics that vary over time included in a path alternation profile may also be referred to, in the present specification, as dynamic alternation characteristics of a path alternation profile. Examples of the one or more dynamic alternation characteristics that may be included in a path alternation profile include, but are not limited to, signal power attenuation, signal delay, signal frequency offset, or signal phase. As is discussed in greater detail below with reference to FIG. 7B, in the example illustrated in FIG. 7A, the channel emulator 730 may generate a first path alternation profile P_AltP1 signal corresponding to a first path of the initial emulated DL signal of the first RRH RRH11 generated by the network emulator 710 and a second path alternation profile P_AltP2 signal corresponding to a second path of the initial emulated DL signal of the first RRH RRH11 generated by the network emulator 710.

FIG. 7B is a flowchart illustrating a method for performing over the air (OTA) testing of a UE in a testing chamber that includes at least one probe antenna, using path alternation profiles. FIG. 7B will be explained with reference to the testing system 7000 of FIG. 7A.

Referring to FIG. 7B, in step S711, an initial emulated DL signal of a first virtual TRP is generated in accordance with a first path alternation profile. For example, the testing equipment 700 (e.g., the network emulator 710) may generate an emulated signal of the first virtual RRH RRH11.

In step S712 a first emulated DL signal representing a first path of the initial emulated DL signal is generated in accordance with a first path alternation profile. For example, according to at least some example embodiments, in step S712 the testing equipment 700 (e.g., the channel emulator 730) may generate a first path alternation profile P_AltP1 emulated signal by using a first path alternation profile P_AltP1 delay unit 742, a first path alternation profile P_AltP1 attenuation unit 744, and a first path alternation profile P_AltP1 frequency offset unit (not illustrated) to apply dynamic delay, power attenuation, and frequency offset values, respectively, to initial emulated DL signal of the first virtual RRH RRH11 generated in step S711. According to at least some example embodiments, the dynamic alternation characteristics of the first path alternation profile P_AltP1 are calculated in order to simulate, within the testing environment of FIG. 7A (e.g., using testing system 7000), the manner in which DL signals received at the DUT 2030 from the first virtual RRH RRH11 via a first path between virtual positions of the DUT 2030 and the first virtual RRH RRH11 would change over time in a particular scenario being tested by the testing system 7000 of FIG. 7A, such as, a high mobility scenario in which the DUT 2030 is moving relative to a virtual position of the virtual TRP (i.e., the first virtual RRH RRH11). According to at least some example embodiments, the dynamic alternation characteristics of the first path alternation profile P_AltP1 may be calculated in the same manner discussed above with respect to the calculation of the dynamic alternation characteristics of first signal alternation profile AltP1, for example, with reference to FIGS. 5A, 5B (e.g., S512), 6A and 6B.

After step S712, the testing equipment 700 may proceed to step S714. In step S714, a second emulated DL signal representing a second path of the initial emulated DL signal is generated in accordance with a second path alternation profile. For example, according to at least some example embodiments, in step S714 the testing equipment 700 (e.g., the channel emulator 730) may generate a second path alternation profile P_AltP2 emulated signal by using a second path alternation profile P_AltP2 delay unit 746, a second path alternation profile P_AltP2 attenuation unit 748, and a second path alternation profile P_AltP2 frequency offset unit (not illustrated) to apply dynamic delay, power attenuation, and frequency offset values, respectively, to the initial emulated DL signal of the first virtual RRH RRH11 generated in step S711. According to at least some example embodiments, the dynamic alternation characteristics of the second path alternation profile P_AltP2 are calculated in order to simulate, within the testing environment of FIG. 7A (e.g., using testing system 7000), the manner in which DL signals received at the DUT 2030 from the first virtual RRH RRH11 via a second path between virtual positions of the DUT 2030 and the first virtual RRH RRH11 would change over time in a particular scenario being tested by the testing system 7000 of FIG. 7A, such as, a high mobility scenario in which the DUT 2030 is moving relative to a virtual position of the virtual TRP (i.e., the first virtual RRH RRH11). According to at least some example embodiments, the dynamic alternation characteristics of the second path alternation profile P_AltP2 may be calculated in the same manner discussed above with respect to the calculation of the dynamic alternation characteristics of the second signal alternation profile AltP2, for example, with reference to FIGS. 5A, 5B (e.g., S514), 6A and 6B.

After step S714, the testing equipment 500 may proceed to step S716. In step S716, the testing equipment 500 provides the first and second emulated DL signals to at least one probe antenna and transmits signals for testing the UE based on the first and second emulated DL signals. For example, as is illustrated in FIG. 7A, the channel emulator 730 includes the combining block 530. According to at least some example embodiments, the combining block 530 of the channel emulator 730 may operate in the same or substantially the same manner as is described above with reference to FIGS. 5, 5B, 6C and 6D for the combining block 530 in the channel emulator 520 of FIG. SA.

For example, the combining block 530 of the channel emulator 730 may include radio frequency (RF) summation circuitry and/or time domain multiplexing circuitry for combining two different emulated DL signals associated with two different virtual TRPs (and, two different alternation profiles) so as to generate a single combined emulated signal that can be transmitted by a single fixed probe antenna so as to simulate, from the perspective of a DUT, two different received DL signals. Accordingly, in step S716 the combining block 530 may receive the first path alternation profile P_AltP1 emulated signal (which is an example of a first emulated DL signal) from the first path alternation profile P_AltP1 attenuation unit 744, receive the second path alternation profile P_AltP2 emulated signal (which is an example of a second emulated DL signal) from the second path alternation profile P_AltP2 attenuation unit 548, combine the two received emulated DL signals by using RF summation circuitry to perform a summation operation on the two received emulated DL signals (e.g., adding the two received emulated DL signals together), and provide the combined emulated DL signal (i.e., the signal resulting from the summation of the received first and second emulated DL signals) to the first probe antenna 2020. Further, the first probe antenna 2020 transmits the combined emulated DL signal to the DUT 2030 in the testing chamber 2100.

Figure 8A:
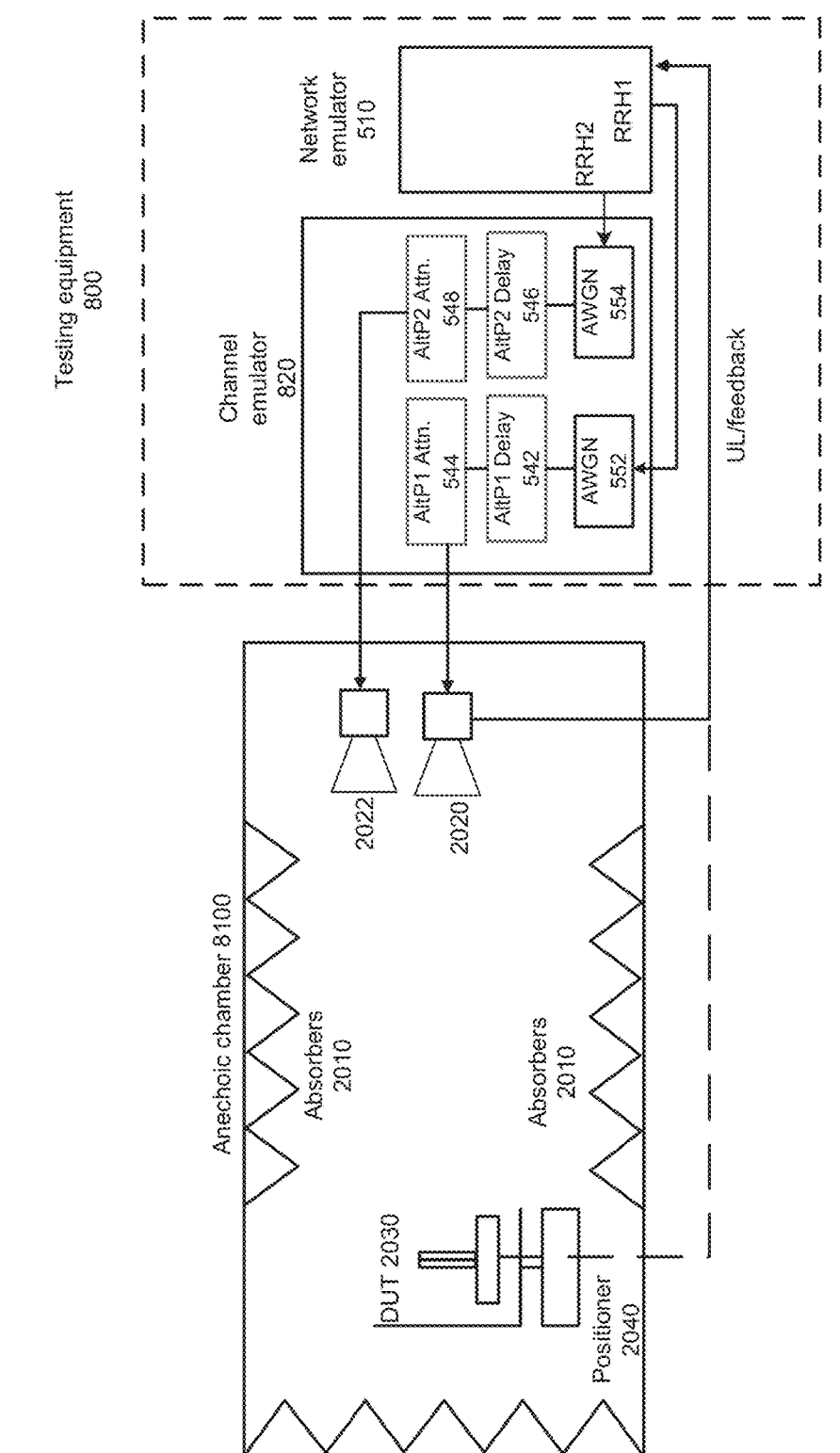
FIG. 8A illustrates an example RRM testing environment, having at least two probe antennas, for performing over the air OTA testing a DUT with respect to non-collocated multiple TRP and/or high mobility UE scenarios according to at least some example embodiments.

FIG. 8A illustrates an example RRM testing environment, having at least two probe antennas, for performing over the air OTA testing on a DUT with respect to non-collocated multiple TRP and/or high mobility UE scenarios according to at least some example embodiments.

The testing environment of FIG. 8A includes a testing system 8000. The testing system 8000 includes a test chamber 8100 and test equipment 800. The structure and contents of test chamber 8100 are similar to those of test chamber 2100 of FIG. 5A. Accordingly, repeated descriptions are omitted. Test chamber 8100 differs from test chamber 2100 in that test chamber 8100 includes a second probe antenna 2022 in addition to the first probe antenna 2020.

The structure of testing equipment 800 of FIG. 8A is similar to the structure of testing equipment 500 of FIG. 5A. Accordingly, repeated descriptions are omitted. Testing equipment 800 differs from testing equipment 500 in that testing equipment 800 includes a channel emulator 820. Channel emulator 820 differs from channel emulator 520 in that the channel emulator 820 does not include the combining block 530. Instead, as is illustrated in FIG. 8A, the channel emulator 820 provides the first signal alternation profile AltP1 emulated signal generated by the first signal alternation profile AltP1 attenuation unit 544 to the first probe antenna 2020 and provides the second alteration profile AltP2 emulated signal generated by the second signal alternation profile AltP2 attenuation unit 548 to the second probe antenna 2020.

According to at least some example embodiments, the testing equipment 800 may have the structure of the system element 200 illustrated in FIG. 1B. Further, according to at least some example embodiments, the network emulator 510 and/or the channel emulator 820, and/or elements thereof (e.g., the first signal alternation profile AltP1 delay unit 542, first signal alternation profile AltP1 attenuation unit 544, second signal alternation profile AltP2 delay unit, second signal alternation profile AltP2 attenuation unit 548, first AWGN unit 552 and/or second AWGN unit 554), are embodied by the testing equipment 800 (e.g., as software/firmware executed by processors of the testing equipment 800 and/or circuitry included in the testing equipment 800). Thus, according to at least some example embodiments, operations described in the present specification as being performed by (or with respect to) the network emulator 510 and/or the channel emulator 820, or an element thereof, may be performed by (or with respect to) the testing equipment 800.

FIG. 8B is a flowchart illustrating a method for performing over the air (OTA) testing of a UE in a testing chamber that includes at least two probe antennas. FIG. 5B will be explained with reference to the testing equipment 800 of the testing system 8000 of FIG. 8A.

Referring to FIG. 8B, in step S812, a first emulated downlink DL signal of a first virtual TRP is generated in accordance with a first signal alternation profile. For example, the testing equipment 800 (e.g., the network emulator 510) may generate an emulated signal of the first virtual RRH RRH11 based upon which the testing equipment 800 (e.g., the channel emulator 820) may generate a first signal alternation profile AltP1 emulated signal. Step S812 may be performed in the same, or substantially the same, manner as that discussed above with respect to step S512 of FIG. 5B. Accordingly, repeated descriptions are omitted.

In step S814, a second emulated downlink DL signal of a second virtual TRP is generated in accordance with a second signal alternation profile. For example, the testing equipment 800 (e.g., the network emulator 510) may generate an emulated signal of the second virtual RRH RRH11 based upon which the testing equipment 800 (e.g., the channel emulator 820) may generate a second signal alternation profile AltP2 emulated signal. Step S814 may be performed in the same, or substantially the same, manner as that discussed above with respect to step S514 of FIG. 5B. Accordingly, repeated descriptions are omitted.

In step S816, the first emulated DL signal is transmitted via a first probe antenna. For example, in step S816, the testing equipment 800 (e.g., channel emulator 820) may provide the first alteration profile AltP1 emulated signal generated by the first signal alternation profile AltP1 attenuation unit 544 to the first probe antenna 2020.

In step S818, the second emulated DL signal is transmitted via a first probe antenna. For example, in step S818, the testing equipment 800 (e.g., channel emulator 820) may provide the second alteration profile AltP2 emulated signal generated by the second signal alternation profile AltP2 attenuation unit 548 to the second probe antenna 2022.

Accordingly, by generating first and second emulated DL signals, which are transmitted by the first and second probe antennas 2020 and 2022, in accordance with the dynamic alternation characteristics of first and second signal alternation profiles AltP1 and AltP2, the testing equipment 800 according to at least some example embodiments facilitates OTA testing of a DUT (e.g., a UE) with respect to a high mobility UE scenario (e.g., HST) even in a testing environment (like that of FIG. 8B) in which positions of the DUT and the probe antennas that transmit the first and second emulated DL signals are fixed or substantially fixed. Further, when the number of emulated DL signals being transmitted in a test operation matches the number of probe antennas being used to transmit the emulated DL signals, like in the testing environment of FIG. 8A, it is possible to test a DUT with respect to a non-collocated multi-TRP scenario without performing RF summation or time domain multiplexing on the emulated DL signals.

In the example testing environment illustrated in FIG. 8A, the first and second probe antennas 2020 and 2022 are both on the same side of the DUT 2030. However, it will be understood that the probe antennas 2020 and 2022 may each be located at other positions within the test chamber 2100, for example, in accordance with the preferences of an entity using the test environment. For example, if the DUT 2030 (e.g., a UE) has two panels oriented into opposite directions, the first and second probe antennas 2020 and 2030 can be also placed on both sides of the DUT 2030 in order to simulate, e.g., a bi-directional HST deployment. Moreover, while each of first and second probe antennas 2020 and 2030 is used to transmit a signal of a single virtual RRH in the example illustrated in FIG. 8A, according to at least some example embodiments, one or both of the first and second probe antennas 2020 and 2022 can be used to transmit emulated signals from multiple virtual RRHs in a manner similar to that shown in FIG. 5A. A testing environment with multiple probe antennas each of which transmit emulated signals from multiple virtual RRHs will now be discussed below with reference to FIG. 9.

Figure 9:
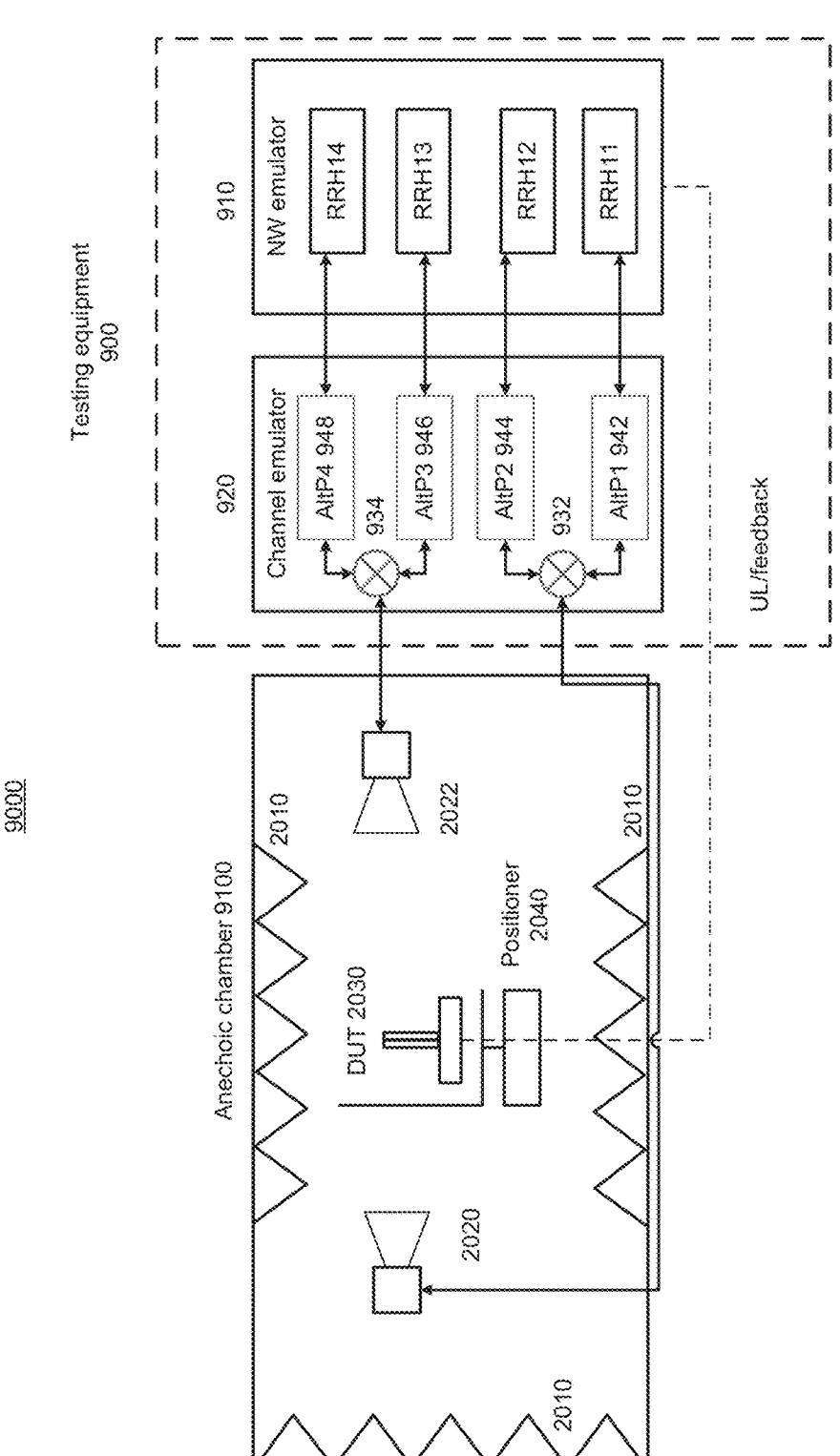
FIG. 9 illustrates an example RRM testing environment, having at least two probe antennas located at opposite sides of a device under test (DUT), for performing over the air OTA testing on a DUT with respect to non-collocated multiple TRP and/or high mobility UE scenarios according to at least some example embodiments.

FIG. 9 illustrates an example RRM testing environment, having at least two probe antennas located at opposite sides of a device under test (DUT), for performing over the air OTA testing on a DUT with respect to non-collocated multiple TRP and/or high mobility UE scenarios according to at least some example embodiments.

The testing environment of FIG. 9 includes a testing system 9000. The testing system 9000 includes a test chamber 9100 and test equipment 900. The structure and contents of test chamber 9100 are similar to those of test chamber 8100 of FIG. 8A. Accordingly, repeated descriptions are omitted. Test chamber 9100 differs from test chamber 8100 in that the first and second probe antennas 2020 and 2022 are located on opposite sides of the DUT 2030. For example, according to at least some example embodiments, a position of the DUT 2030 within the testing chamber 9100 may be between positions of the first and second probe antennas 2020 and 2022, respectively.

Further, testing equipment 900 includes network emulator 910 and channel emulator 920. Network emulator 910 may have a structure similar to that of network emulator 510 of FIG. 5A. Accordingly, repeated descriptions are omitted. Network emulator 910 differs from network emulator 510 in that network emulator 910 generates emulated DL signals for third and fourth virtual RRHs RRH13 and RRH14, in addition to generating emulated DL signals for first and second virtual RRHs RRH11 and RRH12.

The channel emulator 920 may include a first through fourth signal alternation profile units 942-948. The first through fourth signal alternation profile units 942-948 may receive emulated DL signals generated by the network emulator 910 with respect to the first through fourth virtual RRHs RRH11-RRH14, respectively. The first signal alternation profile AltP1 unit 942 may generate a first signal alternation profile AltP1 emulated signal based on the received emulated DL signal of the first virtual RRH RRH11, the second signal alternation profile AltP2 unit 944 may generate a second signal alternation profile AltP2 emulated signal based on the received emulated DL signal of the second virtual RRH RRH12, the third signal alternation profile AltP3 unit 946 may generate a third signal alternation profile AltP3 emulated signal based on the received emulated DL signal of the third virtual RRH RRH13, and the fourth signal alternation profile AltP4 unit 948 may generate a fourth signal alternation profile AltP4 emulated signal based on the received emulated DL signal of the fourth virtual RRH RRH14. According to at least some example embodiments, the first through fourth signal alternation profile units 942-948 may generate first through fourth signal alternation profile emulated signals, respectively, in the same manner discussed with respect to the channel emulator 520 of FIG. 5A. For example, each of the first through fourth signal alternation profile units 942-948 may include an alteration profile delay unit that has the same or substantially the same structure and operation as those of the first signal alternation profile delay unit 542 of FIG. 5A, an alteration profile attenuation unit that has the same or substantially the same structure and operation as those of the first signal alternation profile attenuation unit 544 of FIG. 5A, and an AWGN unit that has the same or substantially the same structure and operation as those of the first AWGN unit 552 of the channel emulator 520 of FIG. 5A.

Further, As is illustrated in FIG. 9, the channel emulator 920 may also include a first combining block 932 and a second combining block 934. According to at least some example embodiments, each of the first and second combining blocks 932 and 934 may have the same structure and operation as those described above with respect to the combining block 530 of FIG. 5A. For example, the first combining block 932 may include an RF summation circuit or a time domain multiplexing circuit (e.g., one or more switch circuits) for performing a summation operation or a time domain multiplexing operation on the first signal alternation profile AltP1 emulated signal generated by the first signal alternation profile AltP1 unit 942 and the second signal alternation profile AltP2 emulated signal generated by the second signal alternation profile AltP2 unit 944, respectively. Similarly, the second combining block 934 may include an RF summation circuit or a time domain multiplexing circuit (e.g., one or more switch circuits) for performing a summation operation or a time domain multiplexing operation on the third signal alternation profile AltP3 emulated signal generated by the third signal alternation profile unit 946 and the fourth signal alternation profile AltP4 emulated signal generated by the fourth signal alternation profile AltP4 unit 948, respectively.

According to at least some example embodiments, the testing equipment 900 may have the structure of the system element 200 illustrated in FIG. 1B. Further, according to at least some example embodiments, the network emulator 910 and/or the channel emulator 920, and/or elements thereof (e.g., the first though fourth signal alternation profile units 942-948, the first combining block 932, and/or the second combining block 934), are embodied by the testing equipment 900 (e.g., as software/firmware executed by processors of the testing equipment 900 and/or circuitry included in the testing equipment 800). Thus, according to at least some example embodiments, operations described in the present specification as being performed by (or with respect to) the network emulator 910 and/or the channel emulator 920, or an element thereof, may be performed by (or with respect to) the testing equipment 900.

In some scenarios and corresponding testing setups, e.g., when the same signal is sent from the different TRPs/RRH in single frequency network (SFN) manner, the resulting Rx signal at the DUT (e.g., a UE) will include multiple realizations of the same signal with different power (e.g., attenuation) and delay values, i.e., it will be a combination of taps. Such channel may be simulated, for example, using tapped delay line (TDL). Traditionally, the taps do not change during the test. However, according to at least some example embodiments, in order to simulate dynamic scenarios in which a UE is mobile, DL signals of different virtual TRPs may be emulated with respect to different signal alternation profiles for each of multiple taps of a TDL. For example, power (e.g., attenuation) and delay values of each tap may be changed dynamically in accordance with the signal alternation profile applied to teach tap. According to at least some example embodiments, the change of taps can be emulated continuously. As is discussed in greater detail below with reference to FIGS. 10A and 10B, the resulting multi-tap channel can then be used with a signal probe antenna of a testing system.

Figure 10A:
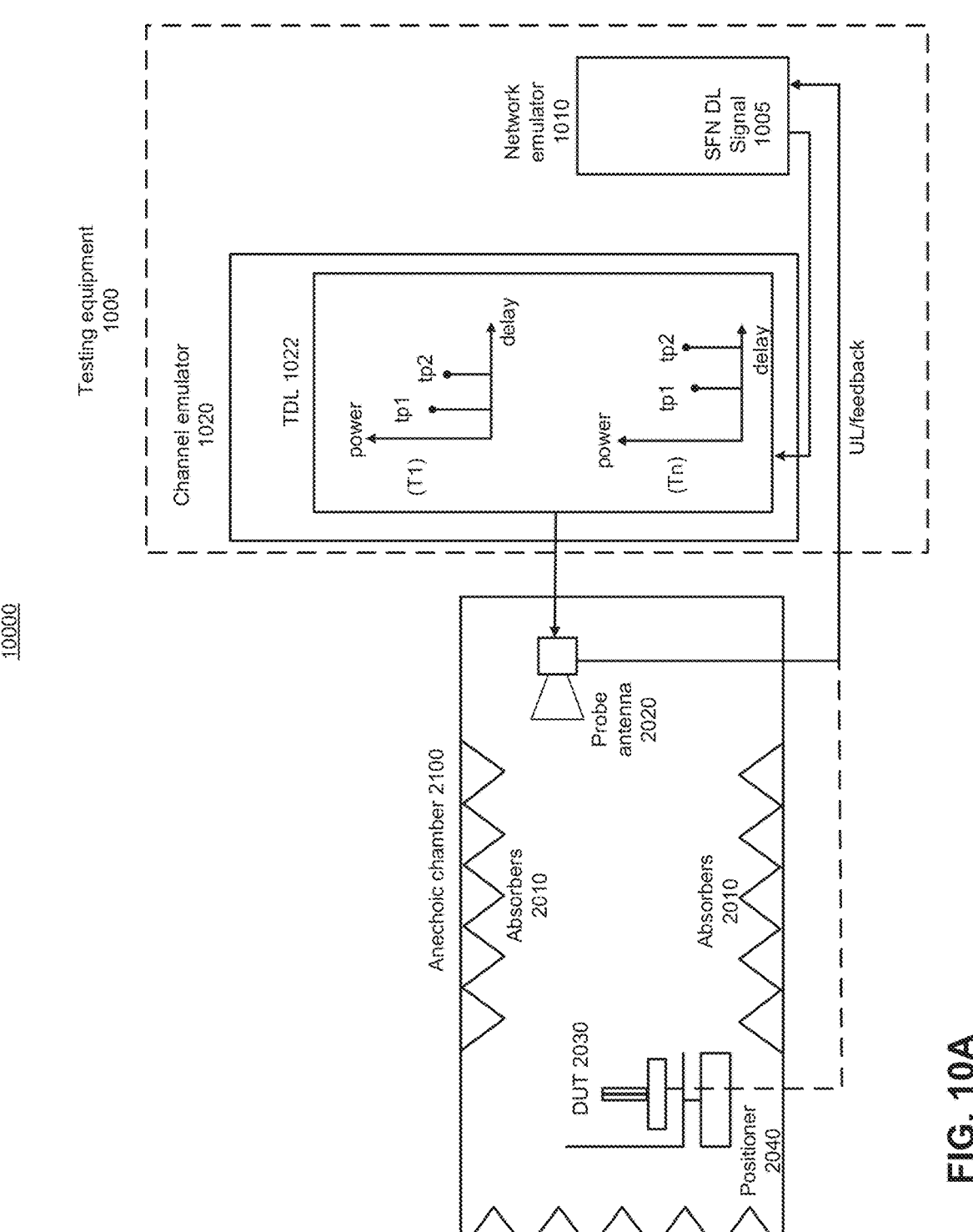
FIG. 10A illustrates an example RRM testing environment for performing over the air OTA testing on a device under test (DUT) with respect to single frequency network (SFN) scenarios that include non-collocated multiple TRPs and/or a high mobility UE according to at least some example embodiments.

FIG. 10A illustrates an example RRM testing environment for performing over the air OTA testing on a device under test (DUT) with respect to SFN scenarios that include non-collocated multiple TRPs and/or a high mobility UE according to at least some example embodiments.

As is illustrated in FIG. 10A, the testing environment of FIG. 10A includes a testing system 10000. The testing system 10000 may include testing chamber 2100 and test equipment 1000. According to at least some example embodiments, the testing chamber 2100 included in the testing system 10000 in FIG. 10A may be the same testing chamber 2100 illustrated in testing system 500 of FIG. 5A, and the testing chamber 2100 included in the testing system 10000 in FIG. 10A may include the same elements illustrated in the testing system 5000 of FIG. 5A. Accordingly, repeated descriptions are omitted. The testing equipment 1000 may include a network emulator 1010 and a channel emulator 1020.

According to at least some example embodiments, the network emulator 1010 generates an emulated DL signal and provides the emulated network signal to taps of a tapped delay line 1022 included in the channel emulator 1020. As is illustrated in FIG. 10A, the emulated DL signal generated by network emulator 1010 may be an SFN DL signal 1005. The SFN DL signal 1005 represents a signal (i.e., a same signal) that may be sent by multiple different TRPs which are part of an SFN. As is discussed below in greater detail with reference to FIG. 10B, according to at least some example embodiments, each tap of the TDL 1022 corresponds to a DL signal of a different virtual TRP in an SFN, and, for each virtual TRP, power and/or delay values of the tap corresponding to the virtual TRP are varied over time (e.g., time (T1), (T2) . . . (Tn), as illustrated in FIG. 10A) in accordance with a signal alternation profile of the virtual TRP.

Alternatively, is discussed below in greater detail with reference to FIG. 10C, the emulated DL signal generated by the network emulator 1010 and provided to the channel emulator 1020 may correspond to a first virtual TRP. As is illustrated in FIG. 10A, the emulated DL signal generated by network emulator 1010 may be an SFN DL signal 1005. The SFN DL signal 1005 represents a signal (i.e., a same signal) that may be sent by multiple different TRPs which are part of an SFN. Further, according to at least some example embodiments, each tap of the TDL 1022 corresponds to a different path by which the emulated DL signal of the first virtual TRP travels to the DUT 2030, and, for each path, power and/or delay values of the tap corresponding to the path are varied over time (e.g., time (T1), (T2) . . . (Tn), as illustrated in FIG. 10A) in accordance with a path alternation profile of the path.

According to at least some example embodiments, the testing equipment 1000 may have the structure of the system element 200 illustrated in FIG. 1B. Further, according to at least some example embodiments, the network emulator 1010 and/or the channel emulator 1020, and/or elements thereof (e.g., TDL 1022), are embodied by the testing equipment 1000 (e.g., as software/firmware executed by processors of the testing equipment 1000 and/or circuitry included in the testing equipment 1000). Thus, according to at least some example embodiments, operations described in the present specification as being performed by (or with respect to) the network emulator 1010 and/or the channel emulator 1020, or an element thereof, may be performed by (or with respect to) the testing equipment 1000.

FIG. 10B is a flowchart illustrating a method for performing OTA testing of a UE in a testing chamber that includes at least one probe antenna using a tapped delay line (TDL). FIG. 10B will be explained with reference to the testing system 10000 of the testing environment illustrated in FIG. 10A.

In step S1030, a first emulated DL signal (e.g., SFN DL signal 1005) is generated (e.g., by network emulator 1010) and the first emulated DL signal is provided to a tapped delay line (TDL) (e.g., TDL 1022).

In step S1032, a delay value and a power value of a first tap of the TDL are set (e.g., by channel emulator 1020) such that the first tap corresponds to a first virtual transmission/reception point (TRP) located at a first virtual location. For example, the channel emulator 1020 may set the delay value and/or a power value of the TDL 1022 in accordance with a first signal alternation profile corresponding to the first virtual TRP.

In step S1034, a delay value and a power value of a second tap of the TDL are set (e.g., by channel emulator 1020) such that the second tap corresponds to a second virtual TRP located at a second virtual location. For example, the channel emulator 1020 may set the delay value and/or a power value of the TDL 1022 in accordance with a first signal alternation profile corresponding to the second virtual TRP.

The first signal alternation profile used in step S1032 and the second signal alternation profile used in step S1034 each include dynamic alternation characteristics. Signal alternation profiles, dynamic characteristics of signal alternation profiles, and methods for determining the dynamic characteristics are discussed above with reference to FIGS. 5A-5B and 6A-6CD. Accordingly, repeated descriptions will be omitted.

In step S1036, the delay value and power value of the first tap are changed over time in accordance with simulated movement of the UE relative to the first virtual location of the first virtual TRP. For example, the channel emulator 1020 may change the delay value and/or power value of the first tap over time in accordance with the first dynamic signal characteristics of the first signal alternation profile.

In step S1038, the delay value and power value of the second tap are changed over time (e.g., by channel emulator 1020) in accordance with simulated movement of the UE relative to the second virtual location of the second virtual TRP. For example, the channel emulator 1020 may change the delay value and/or power value of the first tap over time in accordance with the second dynamic signal characteristics of the second signal alternation profile.

In step S1040, a UE is tested by transmitting (e.g., by channel emulator 1020), via a at least one probe antenna, an output of the TDL.

FIG. 10C is a flowchart illustrating a method for performing OTA testing of a UE in a testing chamber that includes at least one probe antenna using a tapped delay line (TDL), using path alternation profiles. FIG. 10C will be explained with reference to the testing system 10000 of the testing environment illustrated in FIG. 10A.

In step S1050, a first emulated downlink (DL) signal (e.g., SFN DL signal 1005) of a first virtual TRP located at a first virtual location is emulated (e.g., by network emulator 1010), and the first emulated DL signal is provided to a tapped delay line (TDL) (e.g., TDL 1022).

In step S1052, a delay value and a power value of a first tap of the TDL are set (e.g., by channel emulator 1020) such that the first tap corresponds to a first path of the first emulated DL signal. For example, the channel emulator 1020 may set the delay value and/or a power value of the TDL 1022 in accordance with a first path alternation profile corresponding to the first virtual TRP.

In step S1054, a delay value and a power value of a second tap of the TDL are set (e.g., by channel emulator 1020) such that the second tap corresponds to a second path of the first emulated DL signal. For example, the channel emulator 1020 may set the delay value and/or a power value of the TDL 1022 in accordance with a first path alternation profile corresponding to the first virtual TRP.

In step S1056, the delay value and power value of the first and second taps are changed over time (e.g., by channel emulator 1020) in accordance with simulated movement of the UE relative to the first virtual location of the first virtual TRP. The first path alternation profile used in step S1052 and the second path alternation profile used in step S1054 each include dynamic alternation characteristics. Path alternation profiles, dynamic characteristics of signal alternation profiles, and methods for determining the dynamic characteristics are discussed above with reference to FIGS. 8A-8B. Accordingly, repeated descriptions will be omitted.

In step S1058, a UE is tested by transmitting (e.g., by channel emulator 1020), via a at least one probe antenna, an output of the TDL.

Although the terms first, second, etc. may be used herein to describe various elements, these elements should not be limited by these terms. These terms are only used to distinguish one element from another. For example, a first element could be termed a second element, and similarly, a second element could be termed a first element, without departing from the scope of this disclosure. As used herein, the term "and/or," includes any and all combinations of one or more of the associated listed items.

When an element is referred to as being "connected," or "coupled," to another element, it can be directly connected or coupled to the other element or intervening elements may be present. By contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Specific details are provided above to provide a thorough understanding of example embodiments. However, it will be understood by one of ordinary skill in the art that example embodiments may be practiced without these specific details. For example, systems may be shown in block diagrams so as not to obscure the example embodiments in unnecessary detail. In other instances, well-known processes, structures and techniques may be shown without unnecessary detail in order to avoid obscuring example embodiments.

As discussed herein, illustrative embodiments will be described with reference to acts and symbolic representations of operations (e.g., in the form of flow charts, flow diagrams, data flow diagrams, structure diagrams, block diagrams, etc.) that may be implemented as program modules or functional processes include routines, programs, objects, components, data structures, etc., that perform particular tasks or implement particular abstract data types and may be implemented using existing hardware at, for example, existing UE, base stations, eNBs, RRHs, gNBs, femto base stations, network controllers, computers, Central Units (CUs), ng-eNBs, other radio access or backhaul network elements, or the like. Such existing hardware may be processing or control circuitry such as, but not limited to, one or more processors, one or more Central Processing Units (CPUs), one or more controllers, one or more arithmetic logic units (ALUs), one or more digital signal processors (DSPs), one or more microcomputers, one or more field programmable gate arrays (FPGAs), one or more System-on-Chips (SoCs), one or more programmable logic units (PLUs), one or more microprocessors, one or more Application Specific Integrated Circuits (ASICs), or any other device or devices capable of responding to and executing instructions in a defined manner.

Although a flow chart may describe the operations as a sequential process, many of the operations may be performed in parallel, concurrently or simultaneously. In addition, the order of the operations may be re-arranged. A process may be terminated when its operations are completed, but may also have additional steps not included in the figure. A process may correspond to a method, function, procedure, subroutine, subprogram, etc. When a process corresponds to a function, its termination may correspond to a return of the function to the calling function or the main function.

As disclosed herein, the term "storage medium," "computer readable storage medium" or "non-transitory computer readable storage medium" may represent one or more devices for storing data, including read only memory (ROM), random access memory (RAM), magnetic RAM, core memory, magnetic disk storage mediums, optical storage mediums, flash memory devices and/or other tangible machine-readable mediums for storing information. The term "computer readable medium" may include, but is not limited to, portable or fixed storage devices, optical storage devices, and various other mediums capable of storing, containing or carrying instruction(s) and/or data.

Furthermore, example embodiments may be implemented by hardware, software, firmware, middleware, microcode, hardware description languages, or any combination thereof. When implemented in software, firmware, middleware or microcode, the program code or code segments to perform the necessary tasks may be stored in a machine or computer readable medium such as a computer readable storage medium. When implemented in software, a processor or processors will perform the necessary tasks. For example, as mentioned above, according to one or more example embodiments, at least one memory may include or store computer program code, and the at least one memory and the computer program code may be configured to, with at least one processor, cause a network element or network device to perform the necessary tasks. Additionally, the processor, memory and example algorithms, encoded as computer program code, serve as means for providing or causing performance of operations discussed herein.

A code segment of computer program code may represent a procedure, function, subprogram, program, routine, subroutine, module, software package, class, or any combination of instructions, data structures or program statements. A code segment may be coupled to another code segment or a hardware circuit by passing and/or receiving information, data, arguments, parameters or memory contents. Information, arguments, parameters, data, etc. may be passed, forwarded, or transmitted via any suitable technique including memory sharing, message passing, token passing, network transmission, etc.

The terms "including" and/or "having," as used herein, are defined as comprising (i.e., open language). The term "coupled," as used herein, is defined as connected, although not necessarily directly, and not necessarily mechanically. Terminology derived from the word "indicating" (e.g., "indicates" and "indication") is intended to encompass all the various techniques available for communicating or referencing the object/information being indicated. Some, but not all, examples of techniques available for communicating or referencing the object/information being indicated include the conveyance of the object/information being indicated, the conveyance of an identifier of the object/information being indicated, the conveyance of information used to generate the object/information being indicated, the conveyance of some part or portion of the object/information being indicated, the conveyance of some derivation of the object/information being indicated, and the conveyance of some symbol representing the object/information being indicated.

According to example embodiments, UEs, base stations, eNBs, RRHs, gNBs, femto base stations, network controllers, computers, Central Units (CUs), ng-eNBs, other radio access or backhaul network elements, or the like, may be (or include) hardware, firmware, hardware executing software or any combination thereof. Such hardware may include processing or control circuitry such as, but not limited to, one or more processors, one or more CPUs, one or more controllers, one or more ALUs, one or more DSPs, one or more microcomputers, one or more FPGAs, one or more SoCs, one or more PLUs, one or more microprocessors, one or more ASICs, or any other device or devices capable of responding to and executing instructions in a defined manner.

Benefits, other advantages, and solutions to problems have been described above with regard to specific embodiments of the invention. However, the benefits, advantages, solutions to problems, and any element(s) that may cause or result in such benefits, advantages, or solutions, or cause such benefits, advantages, or solutions to become more pronounced are not to be construed as a critical, required, or essential feature or element of any or all the claims.

What is claimed is:

1. A method for performing over the air (OTA) testing of a user equipment (UE) in a testing chamber, the testing chamber including at least one probe antenna, the method comprising:

generating a first emulated downlink (DL) signal of a first virtual transmission/reception point (TRP) in accordance with a first signal alternation profile, the first signal alternation profile including one or more first alternation characteristics that vary over time in accordance with simulated movement of the UE relative to a first virtual location, the first virtual location being a location of the first virtual TRP;

generating a second emulated DL signal of a second virtual TRP in accordance with a second signal alternation profile, the second signal alternation profile including one or more second alternation characteristics that vary over time in accordance with simulated movement of the UE relative to a second virtual location, the second virtual location being a location of the second virtual TRP;

providing the first and second emulated DL signals to the at least one probe antenna; and transmitting, by the at least one probe, signals for testing the UE based on the first and second emulated DL signals, wherein the one or more first alternation characteristics that vary over time and the one or more second alternation characteristics that vary over time include at least one of signal delay, signal frequency offset, or signal phase.

2. The method of claim 1, wherein the providing comprises:

generating a combined emulated DL signal by summing, by a summation circuit, the first and second emulated DL signals; and providing the combined emulated DL signal to the at least one probe antenna, and wherein the transmitting comprises:

transmitting, by the at least one probe antenna, the combined emulated DL signal to the UE.

3. The method of claim 1, wherein the providing comprises:

generating a combined emulated DL signal by multiplexing, by a switch circuit, the first and second emulated DL signals in a time domain; and providing the combined emulated DL signal to the at least one probe antenna, and wherein the transmitting comprises:

transmitting, by the at least one probe antenna, the combined emulated DL signal to the UE.

4. The method of claim 1, wherein the one or more first alternation characteristics that vary over time further include signal power attenuation, and wherein the one or more second alternation characteristics that vary over time further include signal power attenuation.

5. The method of claim 1, wherein the at least one probe antenna includes a first probe antenna located on a first side of the UE in the test chamber and a second probe antenna located on a second side of the UE in the test chamber, wherein the providing of the first and second emulated DL signals includes providing the first and second emulated DL to the first probe antenna, wherein the transmitting includes transmitting, by the first probe antenna, signals for testing the UE based on the first and second emulated DL signals, and wherein the method further comprises:

generating a third emulated DL signal of a third virtual TRP in accordance with a third signal alternation profile, the third signal alternation profile including one or more third alternation characteristics that vary over time in accordance with simulated movement of the UE relative to a third virtual location, the third virtual location being a location of the third virtual TRP;

generating a fourth emulated DL signal of a fourth virtual TRP in accordance with a fourth signal alternation profile, the fourth signal alternation profile including one or more fourth alternation characteristics that vary over time in accordance with simulated movement of the UE relative to a fourth virtual location, the fourth virtual location being a location of the fourth virtual TRP;

providing the third and fourth emulated DL signals to the second probe antenna; and transmitting, by the second probe antenna, signals for testing the UE based on the third and fourth emulated DL signals.

6. The method of claim 1, wherein the at least one probe antenna includes a first probe antenna located on a first side of the UE in the test chamber and a second probe antenna located on a second side of the UE in the test chamber, wherein the providing of the first and second emulated DL signals includes providing the first and second emulated DL to the first probe antenna, wherein the transmitting includes transmitting, by the first probe antenna, signals for testing the UE based on the first and second emulated DL signals, and wherein the method further comprises:

generating a third emulated DL signal of a third virtual TRP in accordance with a third signal alternation profile, the third signal alternation profile including one or more third alternation characteristics that vary over time in accordance with simulated movement of the UE relative to a third virtual location, the third virtual location being a location of the third virtual TRP; and testing the UE by transmitting, by the second probe antenna, the third emulated DL signals.

* * * * *